(12) United States Patent
Kobayashi et al.

(10) Patent No.: US 9,653,599 B2
(45) Date of Patent: May 16, 2017

(54) SEMICONDUCTOR DEVICE AND METHOD OF MANUFACTURING SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Yusuke Kobayashi, Tsukuba (JP); Manabu Takei, Tsukuba (JP); Shinsuke Harada, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/252,623

(22) Filed: Aug. 31, 2016

(65) Prior Publication Data
US 2017/0110571 A1    Apr. 20, 2017

(30) Foreign Application Priority Data
Oct. 20, 2015   (JP) ................................. 2015-206285

(51) Int. Cl.
*H01L 29/15* (2006.01)
*H01L 31/0312* (2006.01)
(Continued)

(52) U.S. Cl.
CPC ...... *H01L 29/7813* (2013.01); *H01L 29/0619* (2013.01); *H01L 29/1608* (2013.01); *H01L 29/66734* (2013.01); *H01L 29/7839* (2013.01)

(58) Field of Classification Search
CPC ............ H01L 29/7806; H01L 29/7813; H01L 29/1608; H01L 29/66734; H01L 29/0619;
(Continued)

(56) References Cited

U.S. PATENT DOCUMENTS 9,472,405 B2 * 10/2016 Nakano ............... H01L 29/8611
9,484,452 B2 * 11/2016 Bobde ................. H01L 29/7813
(Continued)

FOREIGN PATENT DOCUMENTS

JP   2006-093457 A   4/2006
JP   2008-235546 A   10/2008
(Continued)

OTHER PUBLICATIONS

Yuki Nakano et al., "690V, 1.00mΩcm2 4H-SiC Double-Trench MOSFETs", Materials Science Forum (Switzerland), Trans Tech Publications Inc., vols. 717-720, pp. 1069-1072, 2012.

*Primary Examiner* — Thanh Y Tran
(74) *Attorney, Agent, or Firm* — Rabin & Berdo, P.C.

(57) ABSTRACT

In a front surface of a semiconductor base body, a gate trench is disposed penetrating an $n^+$-type source region and a p-type base region to a second n-type drift region. In the second n-type drift region, a p-type semiconductor region is selectively disposed. Between adjacent gate trenches, a contact trench is disposed penetrating the $n^+$-type source region and the p-type base region, and going through the second n-type drift region to the p-type semiconductor region. A source electrode embedded in the contact trench contacts the p-type semiconductor region at a bottom portion and corner portion of the contact trench, and forms a Schottky junction with the second n-type drift region at a side wall of the contact trench.

11 Claims, 25 Drawing Sheets

(51) Int. Cl.
  *H01L 29/78*    (2006.01)
  *H01L 29/16*    (2006.01)
  *H01L 29/66*    (2006.01)
  *H01L 29/06*    (2006.01)

(58) Field of Classification Search
  CPC . H01L 29/7839; H01L 29/407; H01L 29/513;
                     H01L 29/517; H01L 29/518
  See application file for complete search history.

(56) References Cited

U.S. PATENT DOCUMENTS

| | | |
|---|---|---|
| 2003/0040144 A1 | 2/2003 | Blanchard et al. |
| 2008/0230787 A1 | 9/2008 | Suzuki et al. |
| 2009/0166730 A1 | 7/2009 | Okuno et al. |
| 2009/0283776 A1 | 11/2009 | Iwamuro |
| 2012/0261676 A1 | 10/2012 | Nakano |
| 2012/0319132 A1* | 12/2012 | Bhalla .................. H01L 29/407 257/77 |
| 2015/0129895 A1 | 5/2015 | Takeuchi et al. |

FOREIGN PATENT DOCUMENTS

| | | |
|---|---|---|
| JP | 2009-158681 A | 7/2009 |
| JP | 2009-278067 A | 11/2009 |
| JP | 2011-134910 A | 7/2011 |
| JP | 4874516 B2 | 2/2012 |
| JP | 2013-243207 A | 12/2013 |
| JP | 2013-258369 A | 12/2013 |

\* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-206285, filed on Oct. 20, 2015, the entire contents of which are incorporated herein by reference.

BACKGROUND OF THE INVENTION

1. Field of the Invention

Embodiments discussed herein are related to a semiconductor device and method of manufacturing a semiconductor device.

2. Description of the Related Art

Insulated gate field effect transistors (Metal Oxide Semiconductor Field Effect Transistors (MOSFETs)) with a voltage class of 400 V, 600 V, 1200 V, 1700 V, 3300 V, 6500 V, or greater are known as power semiconductor devices. For example, a MOSFET using a silicon carbide (SiC) semiconductor (hereinafter referred to as a SiC-MOSFET) is used in power converting equipment such as a converter/inverter. Lower loss and higher efficiency as well as reduced leak current at the time of turning-off, a smaller size (reduction in chip size), and improved reliability is demanded of such power semiconductor devices.

A vertical MOSFET has a built-in parasitic pn diode formed of a p-type base region and an n-type drift layer as a body diode between the source and drain. Therefore, a free-wheeling diode (FWD) used in an inverter may be eliminated, contributing to reductions in cost and size. However, when a silicon carbide substrate is used as a semiconductor substrate, the parasitic pn diode has a higher built-in potential as compared to the case of using a silicon (Si) substrate and therefore, on-resistance of the parasitic pn diode increases, resulting in increased loss. Additionally, characteristics change over time (degradation occurs over time) consequent to bipolar operation of the parasitic pn diode when the parasitic pn diode is turned on and energized and reliability decreases.

In this regard, an example of a conventional trench type SiC-MOSFET including a contact trench (source trench) between adjacent gate trenches will be described (see, for example, Nakano, Y., et al, "690V, 1.00 mΩcm2 4H—SiC Double-Trench MOSFETs", Materials Science Forum (Switzerland), Trans Tech Publications Inc., Vols. 717-720, pp. 1069-1072, 2012). A gate trench is a trench in which a gate electrode is embedded via a gate insulating film. A contact trench is a trench in which a metal electrode (source electrode) is embedded to form a contact (electric contact portion) between a semiconductor region exposed on an inner wall and the metal electrode. First, a structure of the conventional trench type SiC-MOSFET (hereinafter, referred to as Conventional Example 1) will be described. FIG. 25 is a cross-sectional view of a structure of an active region of the conventional trench type SiC-MOSFET.

As depicted in FIG. 25, Conventional Example 1 includes a trench type MOS gate (an insulated gate formed of metal-oxide-semiconductor) structure and a contact trench 108 on a front surface of an n-type semiconductor substrate 110 in the active region. The active region is a region having a role in current driving. For example, the n-type semiconductor substrate 110 is formed by epitaxially growing an $n^-$-type layer forming an $n^-$-type drift layer 102 on a silicon carbide substrate that is an $n^+$-type drain layer 101. On a front surface (a surface on the $n^-$-type drift layer 102 side) of the n-type semiconductor substrate 110, a MOS gate structure made up of a p-type base region 103, an $n^+$-type source region 104, a gate trench 105, a gate insulating film 106, and a gate electrode 107 is provided.

To relax an electric field applied to the gate insulating film 106 at a bottom portion of the gate trench 105, the depth of the p-type base region 103 between the adjacent gate trenches 105 (in a mesa portion) is made at least partially deeper than the depth of the gate trenches 105. To make the depth of the p-type base region 103 deeper than the depth of the gate trenches 105, in the mesa portion the contact trench 108 deeper than the depth of the gate trenches 105 is disposed. The p-type base region 103 is disposed to cover a source electrode 111 described later over an entire surface of an inner wall of the contact trench 108 and protrudes deeper than the gate trenches 105 toward the drain. The p-type base region 103 is exposed at the inner wall of the contact trench 108.

The $n^+$-type source region 104 is selectively disposed in the p-type base region 103 between each of the adjacent gate trenches 105 and the contact trench 108. The $n^+$-type source region 104 and the p-type base region 103 exposed at the inner wall of the contact trench 108 are exposed at a contact hole 109a penetrating an interlayer insulation film 109 in a depth direction. The source electrode 111 is disposed as a front surface electrode and embedded in the contact hole 109a and the contact trench 108 and contacts the p-type base region 103 and the $n^+$-type source region 104. A drain electrode (not depicted) is disposed as a back surface electrode on a back surface (a surface on the $n^+$-type drain layer 101 side) of the n-type semiconductor substrate 110.

When a positive voltage is applied to the source electrode 111 and a negative voltage is applied to the drain electrode (at turning off of the MOSFET), a pn junction between the p-type base region 103 and the $n^-$-type drift layer 102 is forward-biased. In Conventional Example 1, when a parasitic pn diode formed of the p-type base region 103 and the $n^-$-type drift layer 102 is turned on and energized at the time of turning off the MOSFET, a bipolar operation of the parasitic pn diode causes degradation over time. When the parasitic pn diode is used as a free-wheeling diode, the utilization of the silicon carbide substrate increases the on-resistance. This problem is eliminated by having a parasitic Schottky diode built-in as a body diode between source and drain (see, for example, Japanese Laid-Open Patent Publication No. 2011-134910).

Since the silicon carbide semiconductor has a higher breakdown electric field intensity to avalanche breakdown as compared to a silicon semiconductor, the parasitic Schottky diode may be used as the body diode even at a high breakdown voltage class of 600 V or more. For example, the parasitic Schottky diode is disposed in parallel with the parasitic pn diode between source and drain so that the parasitic Schottky diode is designed to be turned on before the parasitic pn diode is turned on at the time of turning off the MOSFET. This enables prevention of the degradation caused by the bipolar operation of the parasitic pn diode. Since the parasitic Schottky diode has no built-in potential of the pn junction, a lower on-resistance is expected as compared to when only the parasitic pn diode is formed as the body diode.

A structure of a conventional trench type SiC-MOSFET having a parasitic Schottky diode built-in between source and drain (hereinafter referred to as Conventional Example 2) will be described. FIG. 26 is a cross-sectional view of a structure of an active region of another example of the conventional trench type SiC-MOSFET. Conventional Example 2 is different from Conventional Example 1 (see FIG. 25) in that a parasitic Schottky diode is formed as a body diode at a bottom portion of the contact trench 108. For example, as depicted in FIG. 26, in Conventional Example 2, the depth of a p-type base region 113 is shallower than the depth of contact trench 108, and the contact trench 108 penetrates the p-type base region 113 to the n⁻-type drift layer 102 in the depth direction.

A metal film 112 made of nickel is disposed along the inner wall of the contact trench 108 and the source electrode 111 is embedded in the contact trench 108, on the metal film 112. The metal film 112 contacts the n⁻-type drift layer 102 at the bottom portion of the contact trench 108 to form a Schottky junction with the n⁻-type drift layer 102. The metal film 112 functions as a front surface electrode along with the source electrode 111. The source electrode 111 is electrically connected via the metal film 112 to the n⁻-type drift layer 102 at the bottom portion of the contact trench 108. As a result, the parasitic Schottky diode is formed of the n⁻-type drift layer 102 and the front surface electrode (the source electrode 111 and the metal film 112) at the bottom portion of the contact trench 108.

As another trench type MOSFET having a parasitic Schottky diode built-in, a device has been proposed that has a p-type single crystal region of silicon carbide formed in an n-type drift layer in a region facing a curved area of an outer shape of a Schottky electrode formed inside a trench (see, for example, Japanese Laid-Open Patent Publication No. 2013-243207). In Japanese Laid-Open Patent Publication No. 2013-243207, the p-type single crystal region relaxes electric field concentration and suppresses the occurrence of avalanche breakdown to improve the breakdown voltage.

As another trench type MOSFET having a parasitic Schottky diode built-in, a device has been proposed that has respective MOSFET functions implemented at both side walls of a trench as well as a Schottky diode function implemented at a bottom portion of the trench (see, for example, Japanese Patent No. 4874516). In Japanese Patent No. 4874516, a chip area is optimized by incorporating the trench type MOSFET at the side wall of the contact trench having the Schottky diode.

As another trench type MOSFET having a parasitic Schottky diode built-in, a device has been proposed that includes a p-type region at a bottom portion of a contact trench provided with a Schottky diode (see, for example, Japanese Laid-Open Patent Publication No. 2009-278067). In Japanese Laid-Open Patent Publication No. 2009-278067, a p-type region for electric field relaxation is formed at a bottom portion of a contact trench having the Schottky diode so as to improve the breakdown electric field intensity against avalanche breakdown.

As a trench type MOSFET including a p-type region in a trench bottom portion, a device has been proposed that has a deep p-type layer formed to surround a bottom portion and both corners of a gate trench (see, for example, Japanese Laid-Open Patent Publication No. 2008-235546). In Japanese Laid-Open Patent Publication No. 2008-235546, the electric field concentration is prevented in the both corners of the gate trench and the electric field intensity is suppressed to 1 MV/cm or less so as to prevent destruction of a gate oxide film at the both corners of the gate trench.

As another trench type MOSFET including a p-type region at a trench bottom portion, a device has been proposed that has a p-type floating region formed into a substantially circular shape around a bottom portion of a gate trench inside an n-type drift layer (see, for example, Japanese Laid-Open Patent Publication No. 2006-093457). In Japanese Laid-Open Patent Publication No. 2006-093457, peaks of an electric field are formed at two positions in the vicinity of a pn junction between a p-type base region and an n-type drift layer and in the vicinity of a pn junction between the p-type floating region and an n⁻-drift layer to achieve a higher breakdown voltage, so that a lower on-resistance is achieved.

As another trench type MOSFET including a p-type region in a trench bottom portion, a device is proposed that has a bottom p-type layer formed at a lower portion of a gate trench such that a shallowest position of a portion located at a corner of the gate trench is located on the lower side (on the drain side) as compared to a shallowest position of a portion located inside the corner (see, for example, Japanese Laid-Open Patent Publication No. 2009-158681). In Japanese Laid-Open Patent Publication No. 2009-158681, an interval is widened between the bottom p-type layer and a depletion layer extending from a p-type base region to an n-type drift layer so as to suppress an increase in on-resistance.

As a method of manufacturing another trench type MOSFET including a p-type region in a trench bottom portion, a method has been proposed that includes forming a p-type layer epitaxially grown in a trench before forming a p-type SiC layer by leaving the p-type layer only at a bottom portion and both leading end portions of the trench through hydrogen etching (see, for example, Japanese Laid-Open Patent Publication No. 2013-258369). In Japanese Laid-Open Patent Publication No. 2013-258369, the p-type SiC layer is formed in the bottom portion of the trench without using tilted ion implantation, so as to suppress leak current due to a defective damage of ion implantation.

SUMMARY OF THE INVENTION

According to one aspect of the present invention, a semiconductor device includes a first silicon carbide semiconductor layer of a first conductivity type; a first semiconductor region of a second conductivity type, selectively disposed in the first silicon carbide semiconductor layer so that an upper surface of the first semiconductor region is disposed lower than an upper surface of the first silicon carbide semiconductor layer; a second silicon carbide semiconductor layer of the second conductivity type, disposed on the upper surface of the first silicon carbide semiconductor layer; a second semiconductor region of the first conductivity type, selectively disposed in the second silicon carbide semiconductor layer; a first trench penetrating the second semiconductor region and the second silicon carbide semiconductor layer so as to reach the first silicon carbide semiconductor layer; a second trench disposed away from the first trench in a plan view, the second trench penetrating the second semiconductor region and the second silicon carbide semiconductor layer so as to reach the first semiconductor region through the first silicon carbide semiconductor layer;

a gate insulating film formed on a side wall of the first trench; a gate electrode disposed inside the first trench and formed on the gate insulating film; and a metal electrode embedded inside the second trench so as to contact the second semiconductor region and the second silicon carbide semiconductor layer as well as to contact the first semiconductor region at a bottom portion and a corner portion of the second trench so as to form a Schottky junction with the first silicon carbide semiconductor layer, in the side wall of the second trench.

In the semiconductor device, the first semiconductor region has a width greater than a width of the second trench.

The semiconductor device further includes a third semiconductor region of the second conductivity type, penetrating the second silicon carbide semiconductor layer in a depth direction so as to reach the first silicon carbide semiconductor layer and contacting the metal electrode in the side wall of the second trench, the third semiconductor region having an impurity concentration higher than that of the second silicon carbide semiconductor layer.

In the semiconductor device, the second trench has a depth equal to or greater than a depth of the first trench.

The semiconductor device further includes a fourth semiconductor region of the second conductivity type, selectively disposed inside the first silicon carbide semiconductor layer and facing the gate electrode via the gate insulating film at the bottom portion and the corner portion of the first trench.

In the semiconductor device, the second trench has a depth equal to or greater than a depth of the first trench.

The semiconductor device further includes a fifth semiconductor region of the second conductivity type, selectively disposed in the second silicon carbide semiconductor layer and having an impurity concentration higher than that of the second silicon carbide semiconductor layer. The second semiconductor region and the fifth semiconductor region are alternately arranged along a direction orthogonal to a direction of arrangement of the first trench and the second trench.

The semiconductor device further includes a fifth semiconductor region of the second conductivity type, selectively disposed in the second silicon carbide semiconductor layer, at a position lower than the second semiconductor region, the fifth semiconductor region contacting the metal electrode at the side wall of the second trench and having an impurity concentration higher than that of the second silicon carbide semiconductor layer.

The semiconductor device further includes a third silicon carbide semiconductor layer of the first conductivity type, disposed on a lower surface of the first silicon carbide semiconductor layer, the third silicon carbide semiconductor layer having an impurity concentration higher than the first silicon carbide semiconductor layer.

According to another aspect of the present invention, a method of manufacturing a semiconductor device, includes selectively forming a first semiconductor region of a second conductivity type, in a first silicon carbide semiconductor layer of a first conductivity type, so that an upper surface of the first semiconductor region is disposed deeper than an upper surface of the first silicon carbide semiconductor layer; forming a second silicon carbide semiconductor layer of the second conductivity type, on the upper surface of the first silicon carbide semiconductor layer;

selectively forming a second semiconductor region of the first conductivity type, in the second silicon carbide semiconductor layer; forming a first trench penetrating the second semiconductor region and the second silicon carbide semiconductor layer so as to reach the first silicon carbide semiconductor layer; forming a second trench away from the first trench in a plan view, the second trench penetrating the second semiconductor region and the second silicon carbide semiconductor layer so as to reach the first semiconductor region through the first silicon carbide semiconductor layer;

forming a gate electrode in the first trench on a gate insulating film formed on a side wall of the first trench; and embedding a metal electrode inside the second trench such that the metal electrode contacts the second semiconductor region and the second silicon carbide semiconductor layer as well as contacts the first semiconductor region at a bottom portion and a corner portion of the second trench so as to form a Schottky junction between the first silicon carbide semiconductor layer and the metal electrode, in a side wall of the second trench.

In the method, the selectively forming a first semiconductor region includes selectively forming the first semiconductor region in a surface portion of the first silicon carbide semiconductor layer, and increasing a thickness of the first silicon carbide semiconductor layer so that an upper surface of the first semiconductor region becomes lower than the upper surface of the first silicon carbide semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
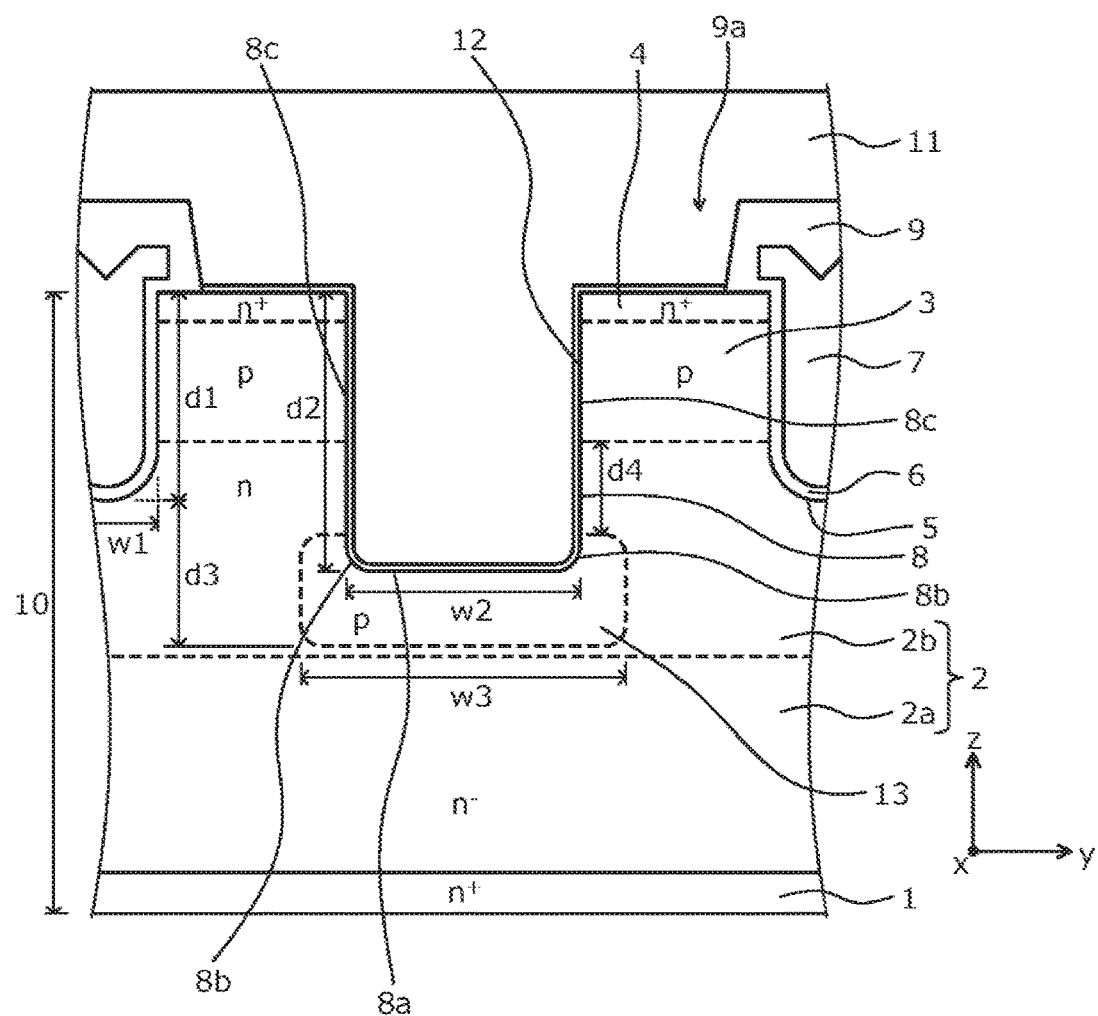
FIG. 1 is a cross-sectional view of a structure of an active region of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 2:
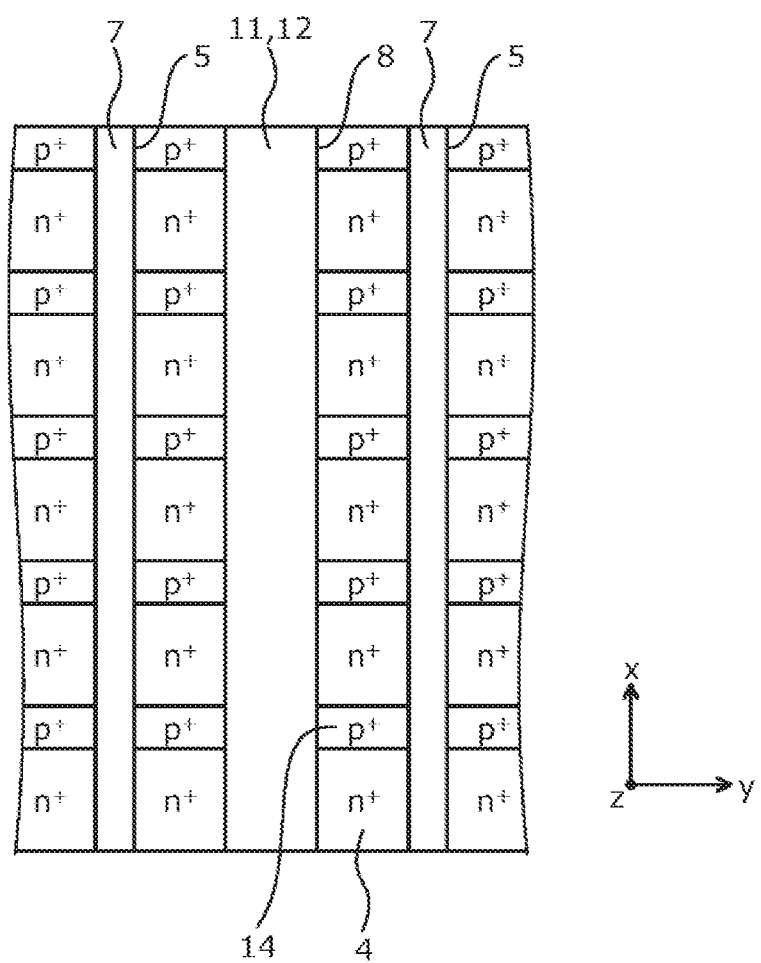
FIG. 2 is a plane view of a planar layout near a contact trench depicted in FIG. 1.

A structure of a semiconductor device according to a first embodiment will be described. FIG. 1 is a cross-sectional view of a structure of an active region of the semiconductor device according to the first embodiment. FIG. 2 is a plane view of a planar layout near a contact trench depicted in FIG. 1. In FIG. 2, a gate insulating film 6 is not depicted. The semiconductor device according to the first embodiment depicted in FIG. 1 is a trench type SiC-MOSFET including a gate trench (first trench) 5 and a contact trench (second trench) 8 in the active region on a front surface side of a semiconductor base body (semiconductor chip) 10. The active region is a region having a role in current driving (a region through which current flows in an on-state). The gate trench 5 is a trench in which a gate electrode 7 is embedded via the gate insulating film 6. The contact trench 8 is a trench in which a front surface electrode (metal electrode: a source electrode 11 and a metal film 12) described later embedded therein to form a contact (an electric contact portion) with the front surface electrode on inner walls 8a to 8c.

For example, as depicted in FIGS. 1 and 2, the semiconductor base body 10 is a silicon carbide epitaxial substrate having an n-type epitaxial layer (first silicon carbide semiconductor layer) forming an n-type drift region 2 and a p-type epitaxial layer (second silicon carbide semiconductor layer) forming a p-type base region 3 grown in this order on an $n^+$-type silicon carbide (SiC) substrate (third silicon carbide semiconductor layer) that is an $n^+$-type drain layer 1. The n-type drift region 2 is made up of an $n^-$-type region (hereinafter referred to as a first $n^-$-type drift region) 2a and an n-type region (hereinafter referred to as a second n-type drift region) 2b different in impurity concentration laminated in order on the $n^+$-type drain layer 1. A front surface (a surface on the epitaxial layer side) of the semiconductor base body 10 is provided with a trench type MOS gate structure made up of a p-type base region 3, an $n^+$-type source region (second semiconductor region) 4, a $p^+$-type contact region (fifth semiconductor region) 14, the gate trench 5, the gate insulating film 6, and the gate electrode 7.

The p-type base region 3 is epitaxially grown on a surface of the n-type drift region 2 on the side opposite to the $n^+$-type drain layer 1 side (a surface of the second n-type drift region 2b). The $n^+$-type source region 4 and the $p^+$-type contact region 14 are diffusion regions each selectively formed in the p-type base region 3 by ion implantation, for example. The $n^+$-type source region 4 faces the gate electrode 7 across the gate insulating film 6 described later. The $n^+$-type source region 4 and the $p^+$-type contact region 14 are alternately repeatedly arranged between the gate trench 5 and the contact trench 8 arranged in a striped planar layout described later, along a direction (hereinafter referred to as a first direction) x along extension of the striped shape of the gate trench 5 and the contact trench 8. The $p^+$-type contact region 14 has a function of reducing contact resistance with the front surface electrode.

The gate trench 5 is disposed in the striped planar layout extending along the first direction x. The gate trench 5 penetrates from the base body front surface through the $n^+$-type source region 4, the $p^+$-type contact region 14, and the p-type base region 3 to the second n-type drift region 2b. In the gate trench 5, the gate insulating film 6 is disposed along an inner wall of the gate trench 5, and the gate electrode 7 is disposed inside the gate trench 5 on the gate insulating film 6. Therefore, the gate electrode 7 faces the $n^+$-type source region 4 and the $p^+$-type contact region 14 across the gate insulating film 6 disposed on a side wall of the gate trench 5. Although FIG. 1 depicts only a portion between the adjacent gate trenches 5 (mesa portion), the gate trench 5 is disposed for each unit cell (a functional unit of a device) disposed in the active region (similarly for FIGS. 3 to 19).

The contact trench 8 is disposed between the adjacent gate trenches 5 in parallel with the gate trenches 5 and away from the gate trenches 5 in a stripe-shaped planar layout extending along the first direction x. For example, when the contact trench 8 is disposed in each mesa portion, the gate trench 5 and the contact trench 8 are alternately repeatedly arranged away from each other along a direction (hereinafter referred to as a second direction) y orthogonal to the first direction x. The contact trench 8 penetrates from the base body front surface through the $n^+$-type source region 4, the $p^+$-type contact region 14, and the p-type base region 3 and goes through the second n-type drift region 2b to a p-type semiconductor region 13. A depth d2 of the contact trench 8 is equal to or greater than a depth d1 of the gate trench 5 (d2≥d1). A width w2 of the contact trench 8 may be wider than a width w1 of the gate trench 5 (w2>w1).

In the second n-type drift region 2b, the p-type semiconductor region (first semiconductor region) 13 is selectively disposed near a boundary with the first $n^-$-type drift region 2a. The contact trench 8 reaches the p-type semiconductor region 13 so that the p-type semiconductor region 13 is exposed at the entire surface of the bottom portion 8a and the corner portions 8b of the contact trench 8. Each of the corner portions 8b of the contact trench 8 is a place where the bottom portion 8a and each of the side walls 8c of the contact trench 8 meet each other and is a corner curved by a predetermined curvature. A width w3 of the p-type semiconductor region 13 is wider than the width w2 of the contact trench 8 (w3>w2). Therefore, the p-type semiconductor region 13 is exposed at the bottom portion 8a and the corner portions 8b of the contact trench 8, while the $n^+$-type source region 4, the $p^+$-type contact region 14, the p-type base region 3, and the second n-type drift region 2b are exposed at the side walls 8c of the contact trench 8.

The depth of the p-type semiconductor region from the base body front surface may be shallower than the second n-type drift region 2b. In particular, the p-type semiconductor region 13 may be disposed away from the interface between the first $n^-$-type drift region 2a and the second n-type drift region 2b. The reason is that the breakdown voltage of the active region may be made lower than the breakdown voltage of a breakdown structure region (not depicted). The breakdown structure region is a region surrounding the periphery of the active region and relaxing the electric field on the base body front surface side of the second n-type drift region 2b to prevent the breakdown voltage. The bottom portion of the gate trench 5 and a lower surface (a surface on the drain side) of the p-type semiconductor region 13 are preferably separated by a distance d3 capable of relaxing the electric field to an extent that the dielectric breakdown of the gate insulating film 6 may be avoided at the bottom portion of the gate trench 5.

An interlayer insulation film 9 is disposed to cover the gate electrode 7. In a contact hole 9a penetrating the interlayer insulation film 9 in a depth direction z, the $n^+$-type source region 4 and the $p^+$-type contact region 14 exposed at the base body front surface are exposed, and the semiconductor regions exposed at the inner walls of the contact trench 8 are exposed. A metal film 12 made of, for example, nickel (Ni), is disposed along the inner walls of the contact trench 8 and the base body front surface exposed in the contact hole 9a. The metal film 12 functions as a front surface electrode along with the source electrode 11 described later. The metal film 12 contacts the $n^+$-type source region 4 and the $p^+$-type contact region 14 from the base body front surface along the side wall 8c of the contact trench 8, thereby making a contact area larger between the portions (the $n^+$-type source region 4 and the $p^+$-type contact region 14) formed on the base body front surface side and the front surface electrode so that the contact resistance may be reduced. Size reduction may be achieved without increasing the contact resistance.

The metal film 12 contacts the surface of the p-type semiconductor region 13 entirely from the bottom portion 8a to the corner portions 8b of the contact trench 8. The metal film 12 contacts the second n-type drift region 2b at the side wall 8c of the contact trench 8 to form a Schottky junction with the second n-type drift region 2b. In particular, the Schottky junction is formed only at a portion of the side wall 8c of the contact trench 8 from a pn junction between the p-type base region 3 and the second n-type drift region 2b to an upper end portion (an end portion on the source side) of the p-type semiconductor region 13. The portion provided with the Schottky junction in the side wall 8c of the contact trench 8 preferably has a distance d4 in the depth direction z corresponding to a height equal to or greater than 1/10 of a cell pitch. The reason is that when a parasitic Schottky diode of the second n-type drift region 2b and the front surface electrode described layer is turned on, current 33 (see FIG. 3) from the source side to the drain side is allowed to sufficiently flow to an extent of satisfying a function as a free-wheeling diode so as not to apply a voltage equal to or greater than a built-in voltage to the parasitic pn diode. The cell pitch is a distance between centers of the contact trenches 8 adjacent to each other across one of the gate trenches 5.

The source electrode 11 is disposed inside the contact hole 9a and the contact trench 8 via the metal film 12 and is electrically connected to the $n^+$-type source region 4, the $p^+$-type contact region 14, the p-type base region 3, the second n-type drift region 2b, and the p-type semiconductor region 13. As a result, at the time of turning off the MOSFET, a parasitic pn diode 22 of the p-type semiconductor region 13 and the second n-type drift region 2b is formed at the bottom portion 8a and the corner portion 8b of the contact trench 8 as described later (see FIG. 3). A parasitic Schottky diode 23 of the second n-type drift region 2b and the front surface electrode (the source electrode 11 and the metal film 12) is formed at the side wall 8c of the contact trench 8. Therefore, the parasitic Schottky diode 23 is formed in parallel with a parasitic pn diode 21 between source and drain (see FIG. 3). The back surface (the surface on the $n^+$-type drain layer 1 side) of the semiconductor base body 10 is provided with a drain electrode (not depicted) as a back surface electrode. The $n^+$-type drain layer 1 has a function of reducing the contact resistance to the drain electrode.

Figure 3:
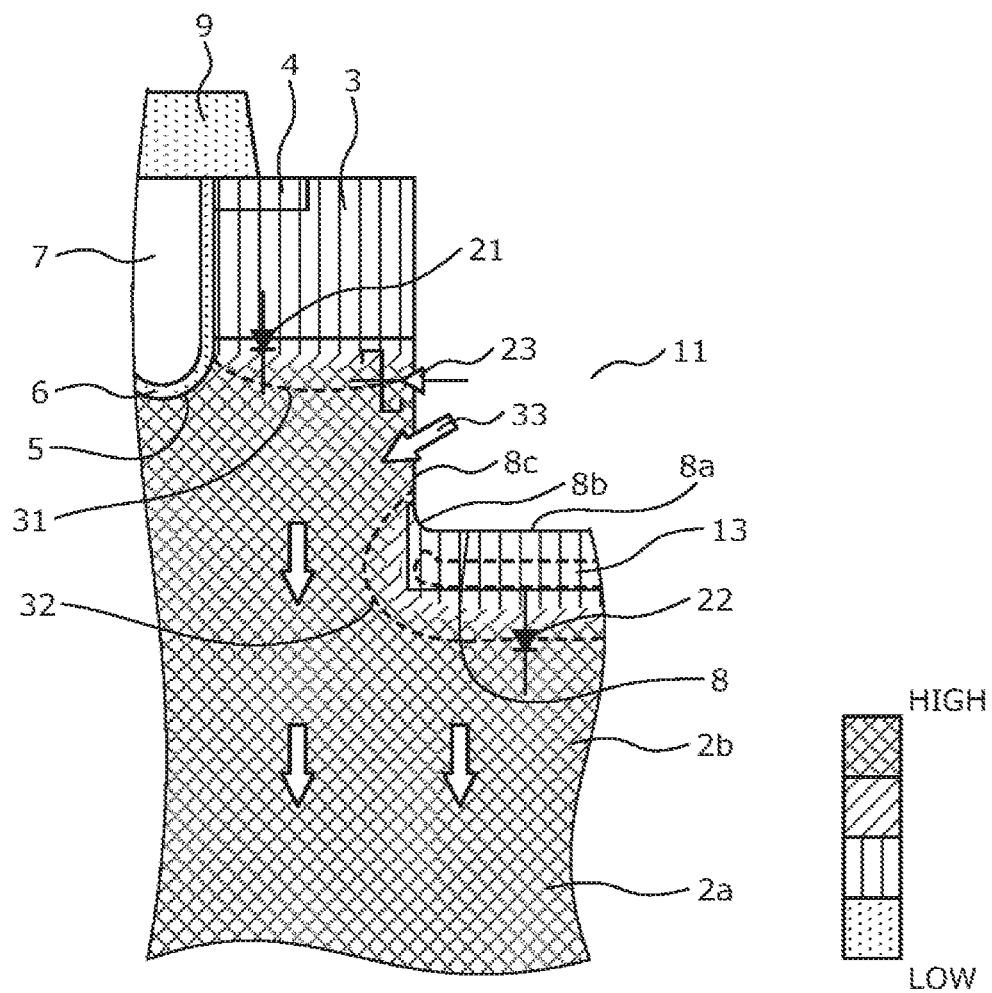
FIG. 3 is an explanatory view of operation at the time of turning off the semiconductor device according to the first embodiment.

An operation (current flow) at the time of turning off the semiconductor device according to the first embodiment will be described. FIG. 3 is an explanatory view of the operation at the time of turning off the semiconductor device according to the first embodiment. In FIG. 3, a flow of the current 33 at the time of turning off the MOSFET depicted in FIGS. 1 and 2 is indicated by white arrows. In FIG. 3, the metal film 12 in FIG. 1 is not depicted. When a positive voltage is applied to the front surface electrode and a negative voltage is applied to the drain electrode (at the time of turning off the MOSFET), a depletion layer 32 extends from the pn junction between the p-type semiconductor region 13 and the second n-type drift region 2b near the bottom portion 8a and the corner portion 8b of the contact trench 8. Since the Schottky junction between the second n-type drift region 2b and the front surface electrode is formed at the side wall 8c of the contact trench 8 as described above, the electric field is hardly applied to the parasitic Schottky diode 23 at the time of turning-off because of the extension of the depletion layer 32 from the pn junction between the p-type semiconductor region 13 and the second n-type drift region 2b. Reference numeral 31 denotes a depletion layer extending from the pn junction between the p-type base region 3 and the second n-type drift region 2b at the time of turning off the MOSFET. At the time of turning-on, the current 33 flows from the source side to the drain side via the parasitic Schottky diode 23 formed in the side wall 8c of the contact trench 8, without passing through the parasitic pn diode 21 formed of the p-type base region 3 and the second n-type drift region 2b. Therefore, among the body diodes formed in the silicon carbide substrate, only the parasitic Schottky diode 23 operates at the time of turning-on without operation of the parasitic pn diode 21 formed of the p-type base region 3 and the second n-type drift region 2b or the parasitic pn diode 22 formed of the p-type semiconductor region 13 and the second n-type drift region 2b. Thus, the degradation over time is not caused by the bipolar operation of the turned-on parasitic pn diodes 21, 22.

A method of manufacturing the semiconductor device according to the first embodiment will be described by taking as an example the case of producing (manufacturing) a trench type SiC-MOSFET of the 3300 V breakdown voltage class. FIGS. 4, 5, 6, 7, 8, 9, and 10 are cross-sectional views of states during manufacturing of the semiconductor device according to the first embodiment. First, for example, a 30-μm-thick $n^-$-type epitaxial layer forming the first $n^-$-type drift region 2a is film-formed (formed) on a front surface of a silicon carbide substrate (semiconductor wafer) forming the $n^+$-type drain layer 1. The impurity concentration of the $n^+$-type drain layer 1 may be about $1 \times 10^{18}/cm^3$ or more and $1 \times 10^{20}/cm^3$ or less, for example. The impurity concentration of the first $n^-$-type drift region 2a may be about $2 \times 10^{15}/cm^3$ or more and $4 \times 10^{15}/cm^3$ or less, for example.

Subsequently, the second n-type drift region 2b is formed to a depth of, for example, about 0.3 μm or more and 1.5 μm or less by photolithography and ion implantation of an n-type impurity such as phosphorus (P) and nitrogen (N) in a surface layer of the first $n^-$-type drift region 2a in the active region. The impurity concentration of the second n-type drift region 2b may be about $1 \times 10^{16}/cm^3$ or more and $1 \times 10^{18}/cm^3$ or less, for example. The p-type semiconductor region 13 is then selectively formed by photolithography and ion implantation of p-type impurities such as aluminum (Al) to a depth of, for example, about 0.3 μm or more and 1.5 μm or less in a surface layer of the second n-type drift region $2b$. The impurity concentration of the p-type semiconductor region 13 may be about $1\times10^{16}/cm^3$ or more and $1\times10^{18}/cm^3$ or less, for example.

Figure 4:
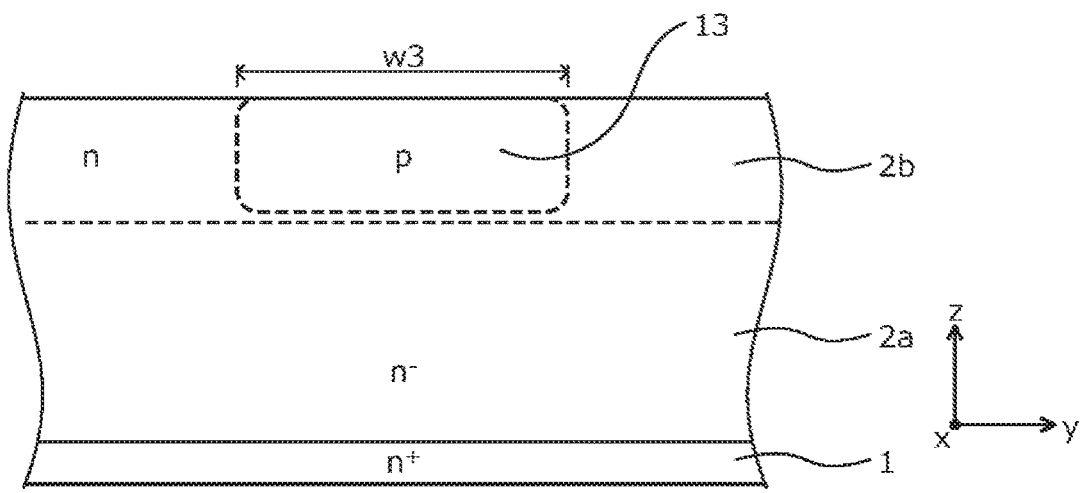
FIGS. 4, 5, 6, 7, 8, 9, and 10 are cross-sectional views of states during manufacturing of the semiconductor device according to the first embodiment.

For example, the width w3 of the p-type semiconductor region 13 may be wider than the contact trench 8 formed later, by about 0.05 μm or more, for example, by about 0.05 μm or more and 5.0 μm or less, outward from the respective side walls thereof. The reason is that leak current increases at the time of turning off the MOSFET when the width w3 of the p-type semiconductor region 13 is narrower than the range described above and higher performance is difficult to achieve by cell pitch reduction when the width w3 is wider than the range. In this case, the p-type semiconductor region 13 may be formed to a depth not reaching the first n⁻-type drift region $2a$. The reason is as described above. As described above, from the viewpoint of relaxation of the electric field of the gate insulating film 6, the distance d3 from the bottom portion of the gate trench 5 to the surface on the lower side (the drain side) of the p-type semiconductor region 13 may be about 1.0 μm or more and 2.5 μm or less, for example. The state at this point is depicted in FIG. 4.

Figure 5:
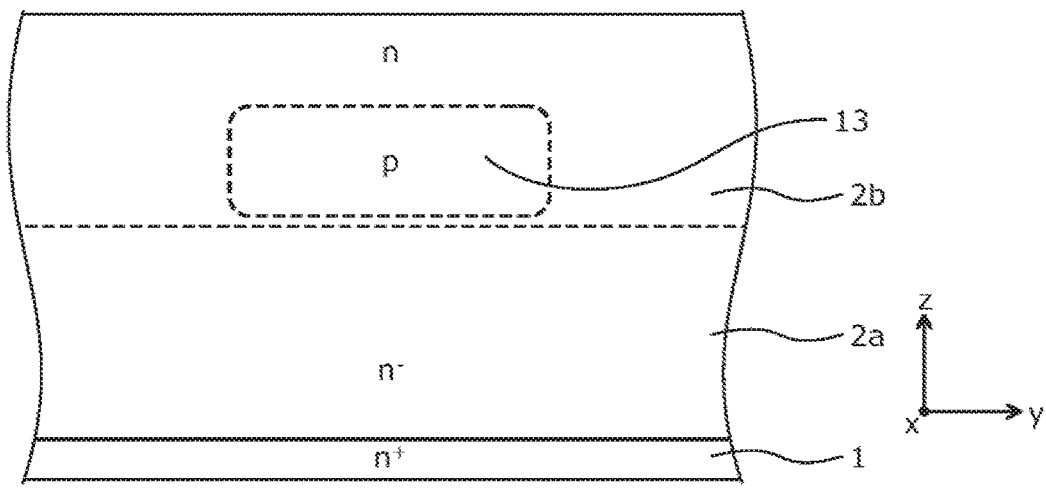

An n-type epitaxial layer of about $1\times10^{16}/cm^3$ or more and $1\times10^{18}/cm^3$ or less, for example, is formed by epitaxial growth to a thickness of about 0.5 μm or more and 3.0 μm or less, for example, to cover the p-type semiconductor region 13, thereby increasing the thickness of the second n-type drift region $2b$. The state at this point is depicted in FIG. 5. A p-type epitaxial layer forming the p-type base region 3 and having a thickness of about 0.3 μm or more and 2.0 μm or less, for example, is formed by epitaxial growth on the surface of the second n-type drift region $2b$. As a result of steps to this point, the semiconductor base body (silicon carbide epitaxial wafer) 10 is produced that has the n-type epitaxial layer forming the n-type drift region 2 and the p-type epitaxial layer forming the p-type base region 3 grown sequentially on the silicon carbide substrate forming the n⁺-type drain layer 1. The impurity concentration of the p-type base region 3 may be about $1\times10^1/cm^3$ or more and $1\times10^{19}/cm^3$ or less, for example.

Figure 6:
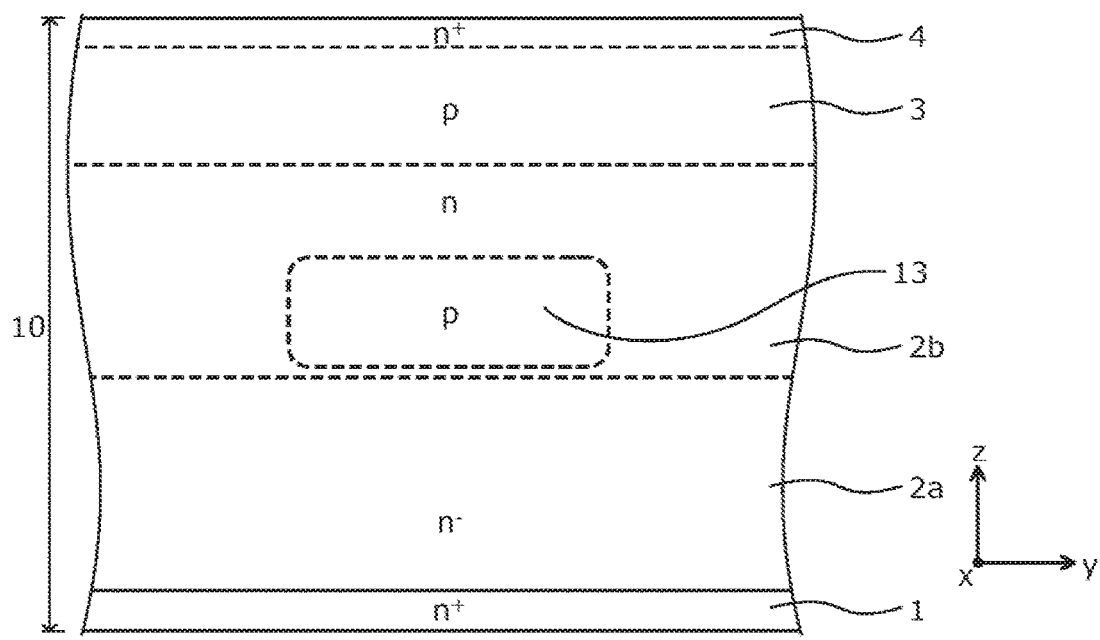

The n⁺-type source region 4 is selectively formed by photolithography and ion implantation of an n-type impurity such as phosphorus and nitrogen in a surface layer of the p-type base region 3. The p⁺-type contact region 14 is then selectively formed by photolithography and ion implantation of a p-type impurity such as aluminum in the surface layer of the p-type base region 3 and is alternately repeatedly arranged with the n⁺-type source region 4 along the first direction x. The impurity concentration of the n⁺-type source region 4 may be about $1\times10^{18}/cm^3$ or more and $1\times10^{20}/cm^3$ or less, for example. The impurity concentration of the p⁺-type contact region 14 may be about $1\times10^{18}/cm^3$ or more and $1\times10^{20}/cm^3$ or less, for example. Both the n⁺-type source region 4 and the p⁺-type contact region 14 may have a depth of about 0.1 μm or more and 0.5 μm or less, for example. The n⁺-type source region 4 and the p⁺-type contact region 14 may be formed in the reverse order. The state at this point is depicted in FIG. 6.

Figure 7:
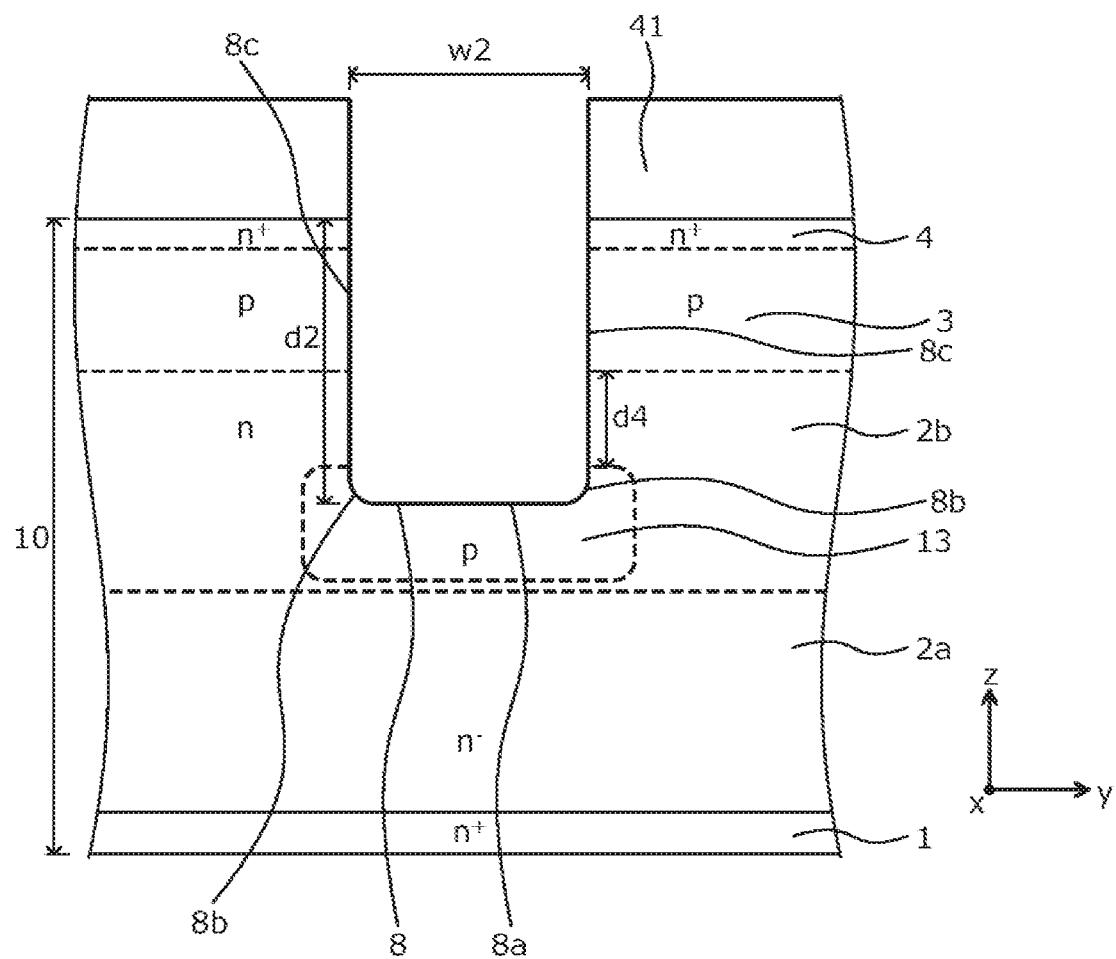

Subsequently, an oxide film 41 is deposited (formed) on the base body front surface (the surface on the n⁺-type source region 4 side) to a thickness of about 1.5 μm or more and 2.5 μm or less, for example. The oxide film 41 is patterned by photolithography and etching to remove a portion corresponding to the contact trench 8 in the oxide film 41. Subsequently, after removing a resist mask (not depicted) used for patterning of the oxide film 41, etching is performed by using a remaining portion of the oxide film 41 as a mask to form the contact trench 8 to a depth d2 allowing the bottom portion $8a$ and the corner portions $8b$ to reach the p-type semiconductor region 13. At this step, the second n-type drift region $2b$ is exposed at the side wall $8c$ of the contact trench 8 such that the distance d4 in the depth direction z of the Schottky junction formed later in the side wall $8c$ of the contact trench 8 satisfies the range described above. For example, the depth d2 of the contact trench 8 is equal to or greater than the depth d1 of the gate trench 5 described later and may be about 1.0 μm or more and 5.0 μm or less, for example. The width w2 of the contact trench 8 may be about 0.1 μm or more and 3.0 μm or less, for example. The state at this point is depicted in FIG. 7.

Figure 8:
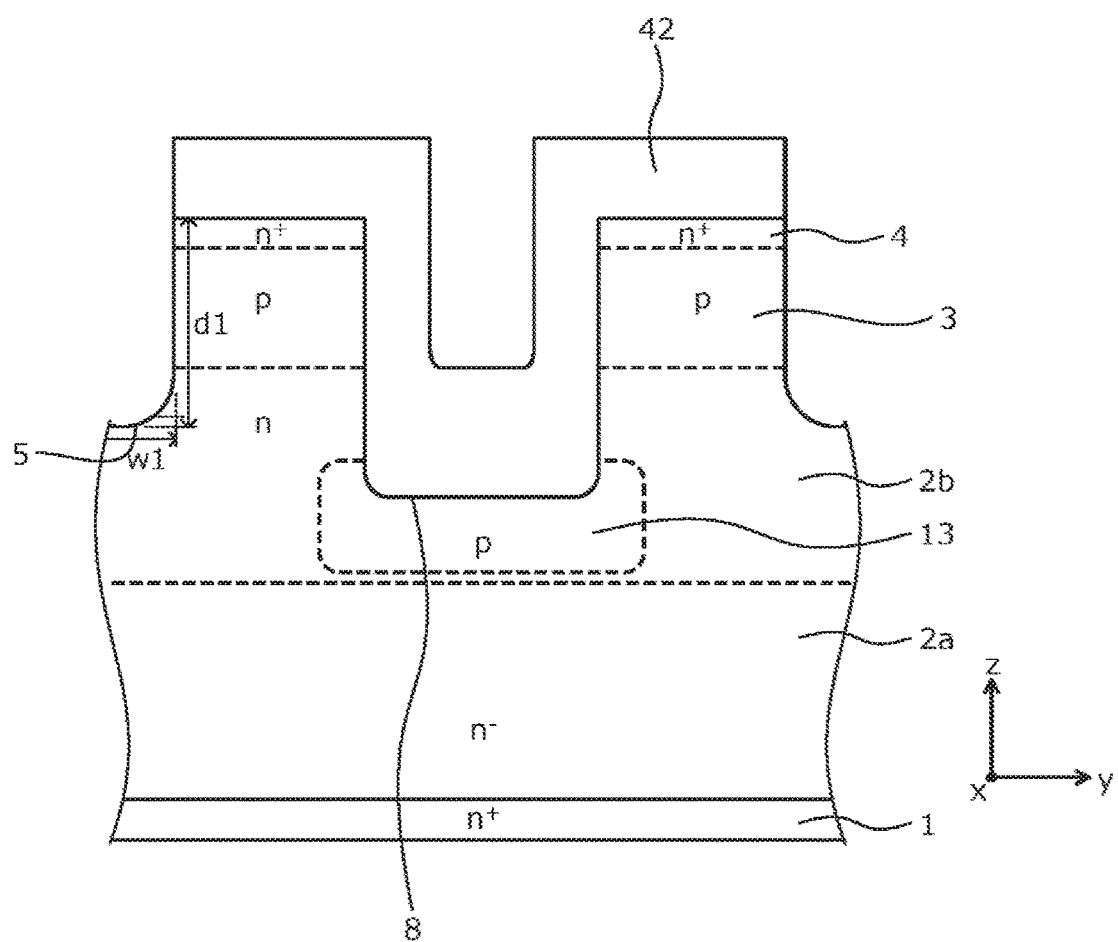

Subsequently, after removing the remaining portion of the oxide film 41 with, for example, hydrofluoric acid (HF), an oxide film 42 is newly deposited on the base body front surface to a thickness of about 1.5 μm or more and 2.5 μm or less, for example. The oxide film 42 is patterned by photolithography and etching to remove a portion corresponding to the gate trench 5 in the oxide film 42. Subsequently, after removing a resist mask (not depicted) used for patterning of the oxide film 42, etching is performed by using a remaining portion of the oxide film 42 as a mask to form the gate trench 5. The depth d1 of the gate trench 5 may be about 0.5 μm or more and 5.0 μm or less, for example. The width w1 of the gate trench 5 may be about 0.5 μm or more and 2.0 μm or less, for example. The gate trench 5 and the contact trench 8 may be formed in the reverse order. The state at this point is depicted in FIG. 8.

Figure 9:
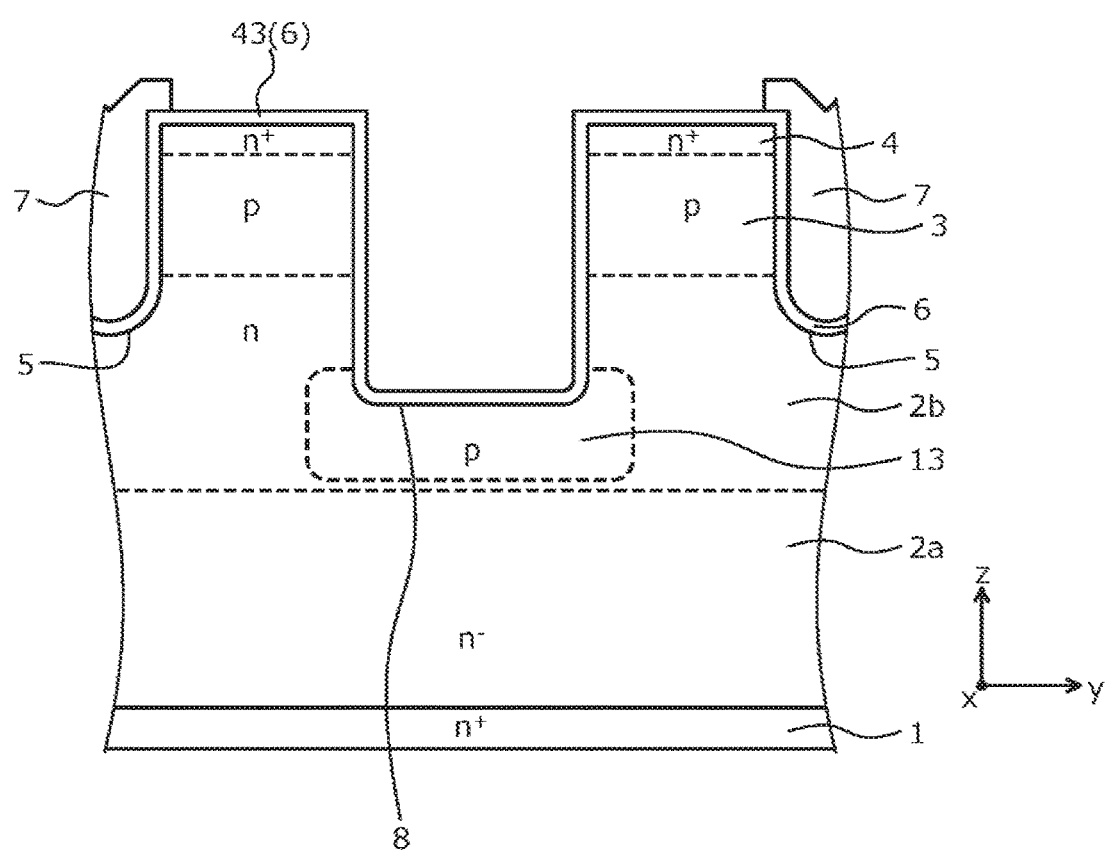

Subsequently, after removing the remaining portion of the oxide film 42, an oxide film ($SiO_2$ film) 43 having a thickness of, for example, about 10 nm or more and 500 nm or less and forming the gate insulating film 6 is deposited along the inner wall of the gate trench 5 and is heat treated in a nitrogen ($N_2$) atmosphere at a temperature of about 800 degrees C. or more and 1200 degrees C. or less. For example, a polysilicon (poly-Si) layer is then deposited to a thickness of 0.3 μm or more and 1.5 μm or less on the base body front surface and embedded inside the gate trench 5, on the oxide film 43 therein. The polysilicon layer is patterned by photolithography and etching to form the gate electrode 7. The state at this point is depicted in FIG. 9.

Subsequently, an oxide layer having a thickness of about 0.5 μm or more and 1.5 μm or less, for example, is deposited as the interlayer insulation film 9 on the base body front surface. The interlayer insulation film 9 is patterned by photolithography and etching to form the contact hole $9a$. At this step, the oxide film 43 is patterned along with the interlayer insulation film 9 to expose the semiconductor regions. As a result, the n⁺-type source region 4, the p⁺-type contact region 14, p-type base region 3, the second n-type drift region $2b$, and the p-type semiconductor region 13 are exposed at the base body front surface and the inner wall of the contact trench 8 in an opening portion of a resist film 44 used for patterning the interlayer insulation film 9 (i.e., the contact hole $9a$).

Figure 10:
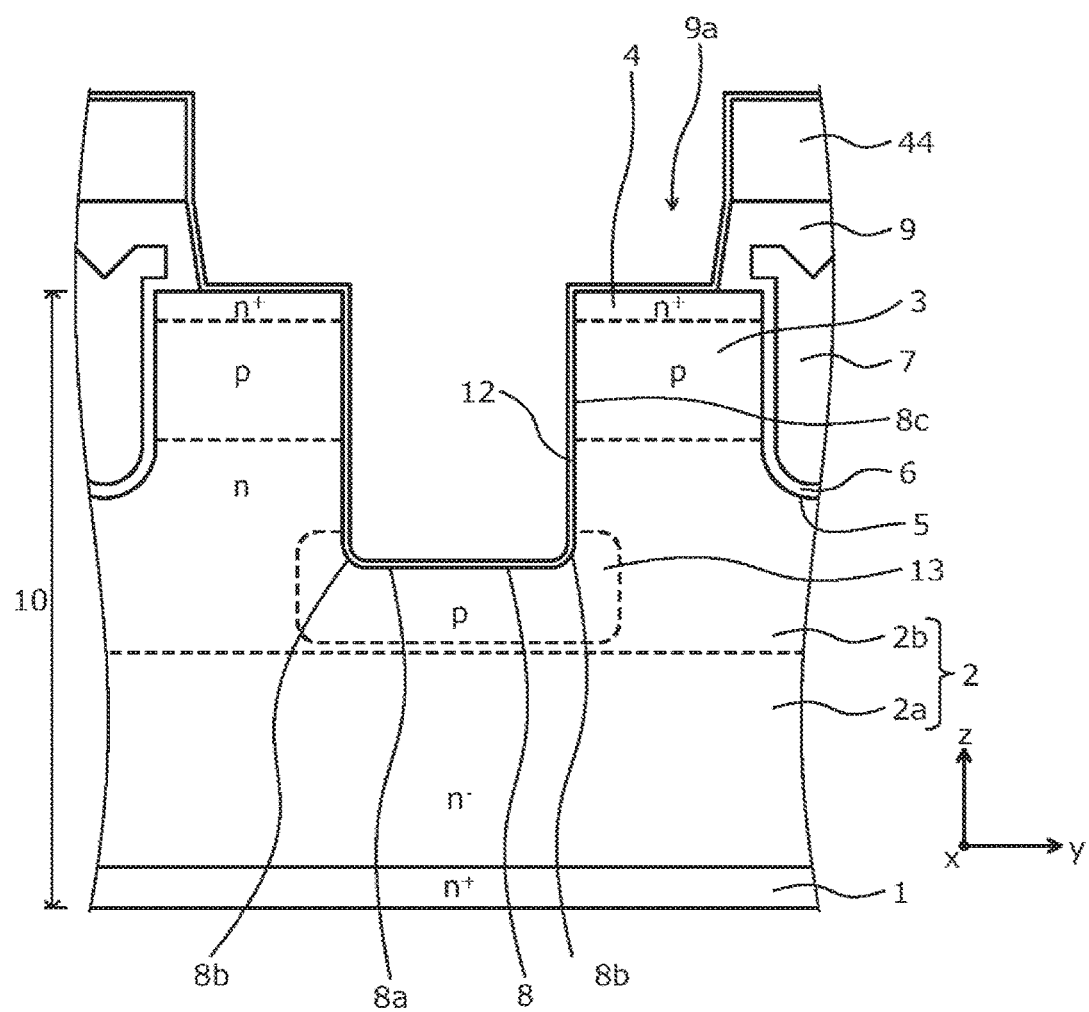

The metal film 12 is deposited (formed) along the base body front surface and the inner wall of the contact trench 8, exposed in the opening portion of the resist film 44 while the resist film 44 used for patterning the interlayer insulation film 9 is left. The state at this point is depicted in FIG. 10. The semiconductor base body 10 subjected to the above processes is immersed in acetone, for example, to execute a lift-off process of removing the metal film 12 on the resist film 44 along with the resist film 44. For example, the source electrode 11 made of aluminum is then deposited (formed) on the base body front surface and embedded within the contact trench 8. Subsequently, the wafer is cut into individual chip shapes to complete the trench type SiC-MOSFET depicted in FIGS. 1 and 2.

As described above, according to the first embodiment, the p-type semiconductor region having a width wider than the contact trench is disposed to cover the front surface electrode at the entire surface of the bottom portion and the corner portions of the contact trench, so that the Schottky junction between the second n-type drift region and the front surface electrode is formed only in the side wall of the contact trench. As a result, when the parasitic Schottky diode formed of the second n-type drift region and the front surface electrode is turned on, the parasitic pn diode formed of the p-type base region and the second n-type drift region is not turned on. Therefore, the degradation over time is not caused by the bipolar operation of the parasitic pn diode. Additionally, since the front surface electrode is covered with the p-type semiconductor region at the entire surface of the bottom portion and the corner portions of the contact trench, the electric field applied to the Schottky junction between the second n-type drift region and the front surface electrode may be relaxed at the time of turning off the MOSFET. As a result, the leak current may be reduced in the parasitic Schottky diode formed of the second n-type drift region and the front surface electrode. According to the first embodiment, among the body diodes formed in the silicon carbide substrate, only the parasitic Schottky diode operates, resulting in a monopolar operation. Therefore, a reverse recovery current during reverse recovery operation may be substantially zero, and a turn-on loss and surge voltage may be reduced.

Figure 11:
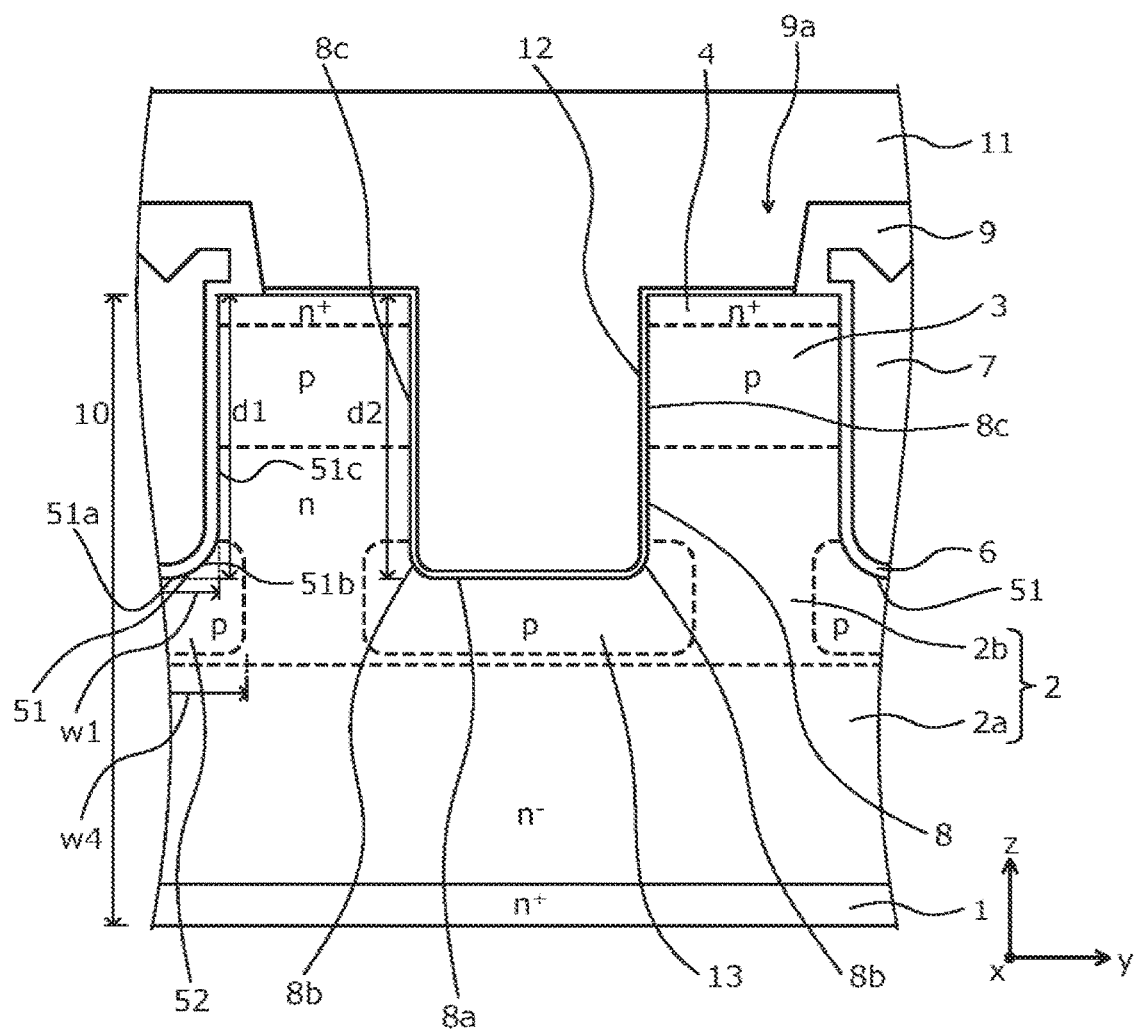
FIG. 11 is a cross-sectional view of a structure of an active region of the semiconductor device according to a second embodiment.

A structure of a semiconductor device according to a second embodiment will be described. FIG. 11 is a cross-sectional view of a structure of an active region of the semiconductor device according to the second embodiment. The planar layout near the contact trench 8 of FIG. 11 is the same as in the first embodiment (see FIG. 2). The semiconductor device according to the second embodiment is different from the semiconductor device according to the first embodiment in that a p-type semiconductor region (hereinafter referred to as a second p-type semiconductor region (a fourth semiconductor region)) 52 is disposed to cover the gate electrode 7 via the gate insulating film 6 at the entire surface of a bottom portion 51$a$ and a corner portion 51$b$ of a gate trench 51.

The second p-type semiconductor region 52 is disposed inside the second n-type drift region 2$b$ away from the p-type semiconductor region (hereinafter referred to as a first p-type semiconductor region) 13 of the bottom portion 8$a$ of the contact trench 8. A width w4 of the second p-type semiconductor region 52 is wider than a width w1 of the gate trench 51 (w4>w1). By disposing the second p-type semiconductor region 52 in this way, the electric field applied to the gate insulating film 6 may be relaxed at the bottom portion 51$a$ of the gate trench 51. As a result, the electric field applied to the gate insulating film 6 may be relaxed without increasing the distance from the bottom portion 51$a$ of the gate trench 51 to the lower surface of the first p-type semiconductor region 13 (reference numeral d3 of FIG. 1) to a predetermined range or more. Therefore, the depth d2 of the contact trench 8 may be equal to or less than the depth d1 of the gate trench 51 (d2≤d1).

A method of manufacturing the semiconductor device according to the second embodiment will be described by taking as an example a case of producing a 3300 V trench-type SiC-MOSFET. FIGS. 12, 13, 14, 15, and 16 are cross-sectional views of states during manufacturing of the semiconductor device according to the second embodiment. In the method of manufacturing the semiconductor device according to the second embodiment, for example, the second p-type semiconductor region 52 may be formed along with the first p-type semiconductor region 13 when the first p-type semiconductor region 13 is formed in the method of manufacturing the semiconductor device according to the first embodiment. For example, first, similar to the first embodiment, the first n$^-$-type drift region 2$a$ is epitaxially grown on the front surface of the silicon carbide substrate (semiconductor wafer) forming the n$^+$-type drain layer 1, and the second n-type drift region 2$b$ is formed by photolithography and ion implantation in the surface layer of the first n$^-$-type drift region 2$a$.

Figure 12:
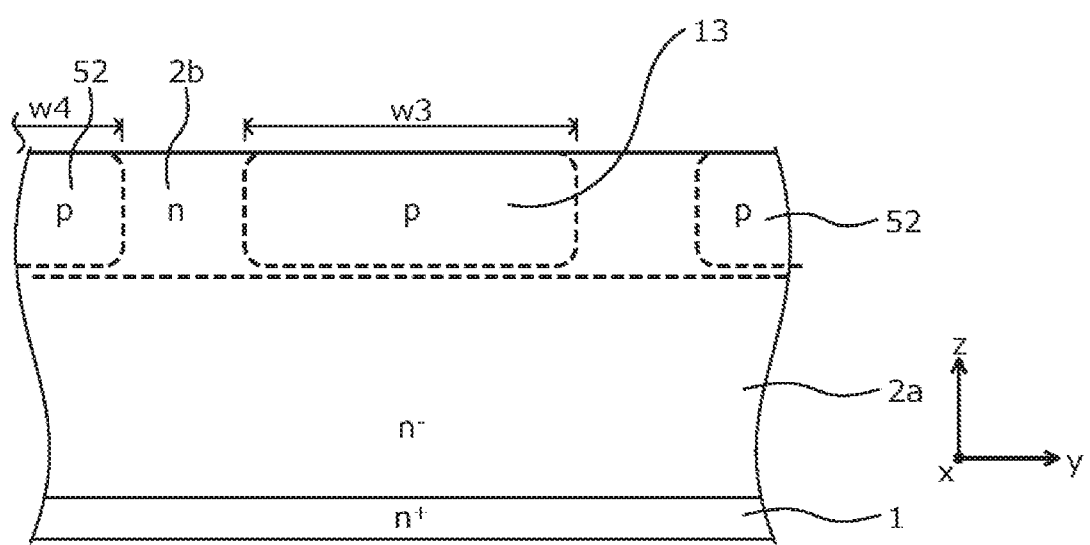
FIGS. 12, 13, 14, 15, and 16 are cross-sectional views of states during manufacturing of the semiconductor device according to the second embodiment.

Subsequently, similar to the first embodiment, the first p-type semiconductor region 13 is selectively formed by photolithography and ion implantation in the surface layer of the second n-type drift region 2$b$. At this step, the second p-type semiconductor region 52 is selectively formed in the surface layer of the second n-type drift region 2$b$ along with the first p-type semiconductor region 13 away from the first p-type semiconductor region 13. The width w3 of the first p-type semiconductor region 13 may be the same as in the first embodiment. The width w4 of the second p-type semiconductor region 52 may be about 0.3 µm or more and 2.0 µm or less, for example. The state at this point is depicted in FIG. 12.

Figure 13:
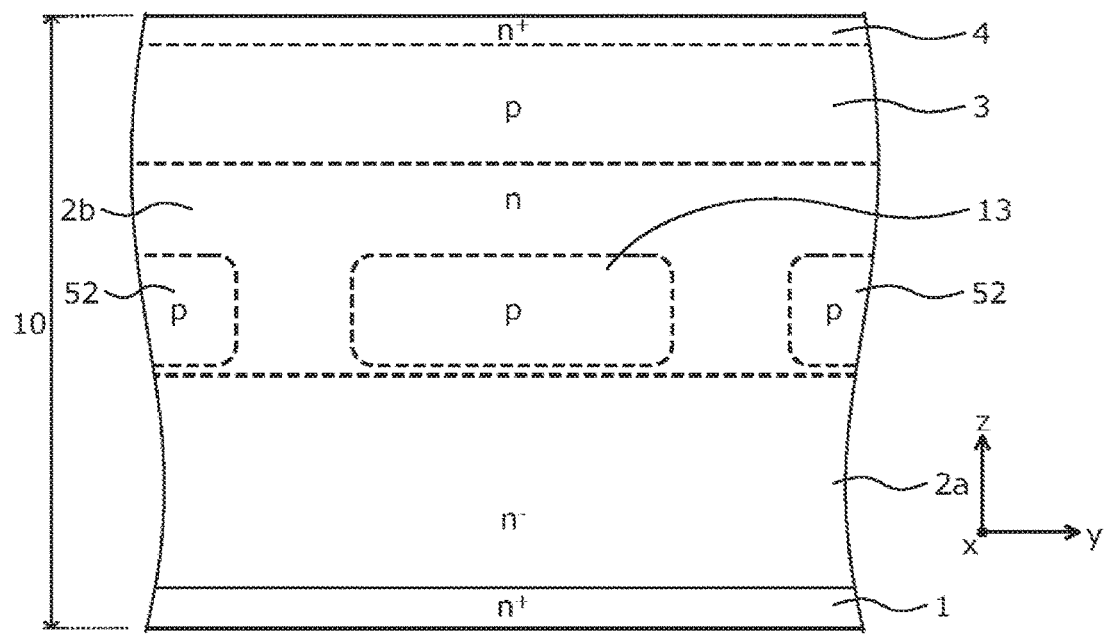

Subsequently, similar to the first embodiment, an n-type epitaxial layer is grown by epitaxial growth to cover the first and second p-type semiconductor regions 13, 52, thereby increasing the thickness of the second n-type drift region 2$b$. Similar to the first embodiment, the p-type base region 3 is epitaxially grown on the second n-type drift region 2$b$ to produce the semiconductor base body (silicon carbide epitaxial wafer) 10. The photolithography and the ion implantation are repeatedly performed similar to the first embodiment to selectively form each of the n$^+$-type source region 4 and the p$^+$-type contact region 14 sequentially in the surface layer of the p-type base region 3. The state at this point is depicted in FIG. 13.

Figure 14:
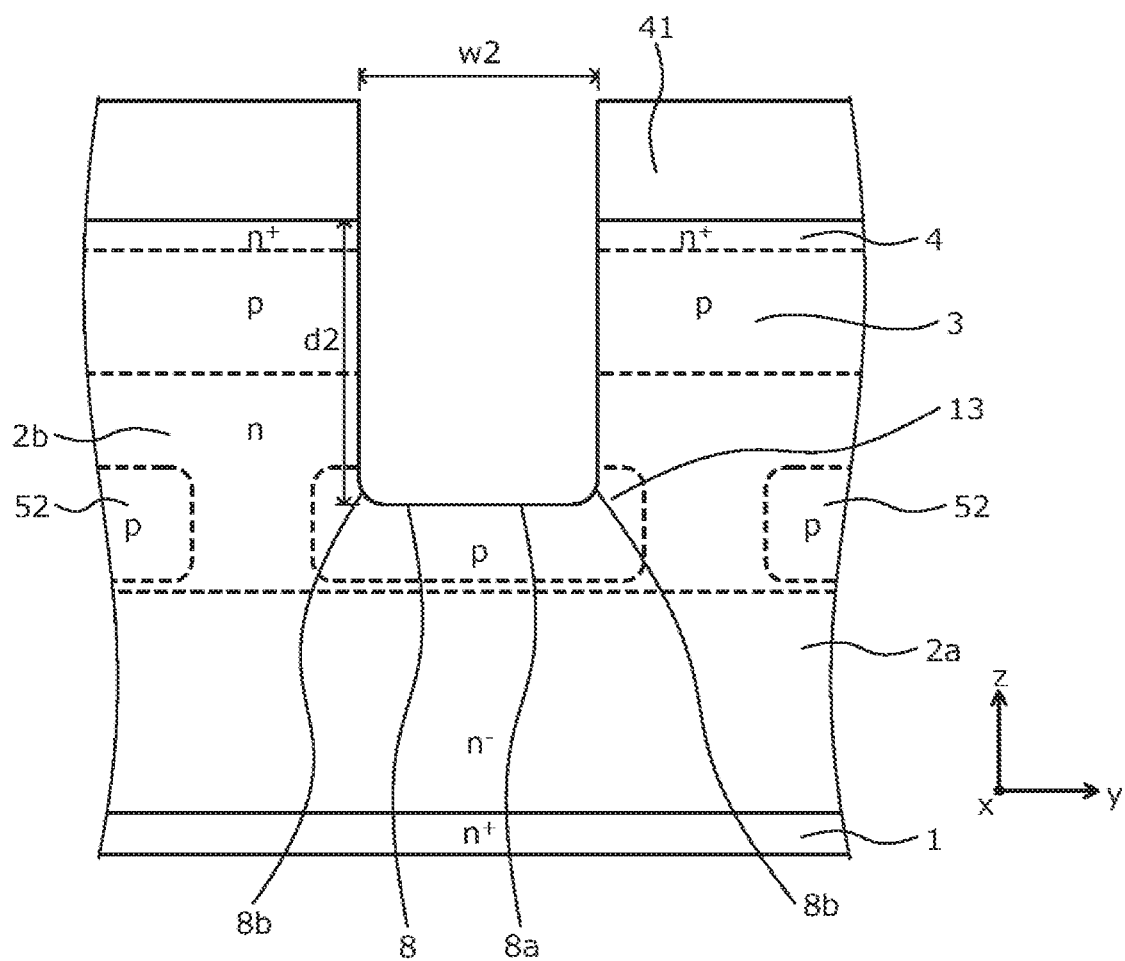
Figure 15:
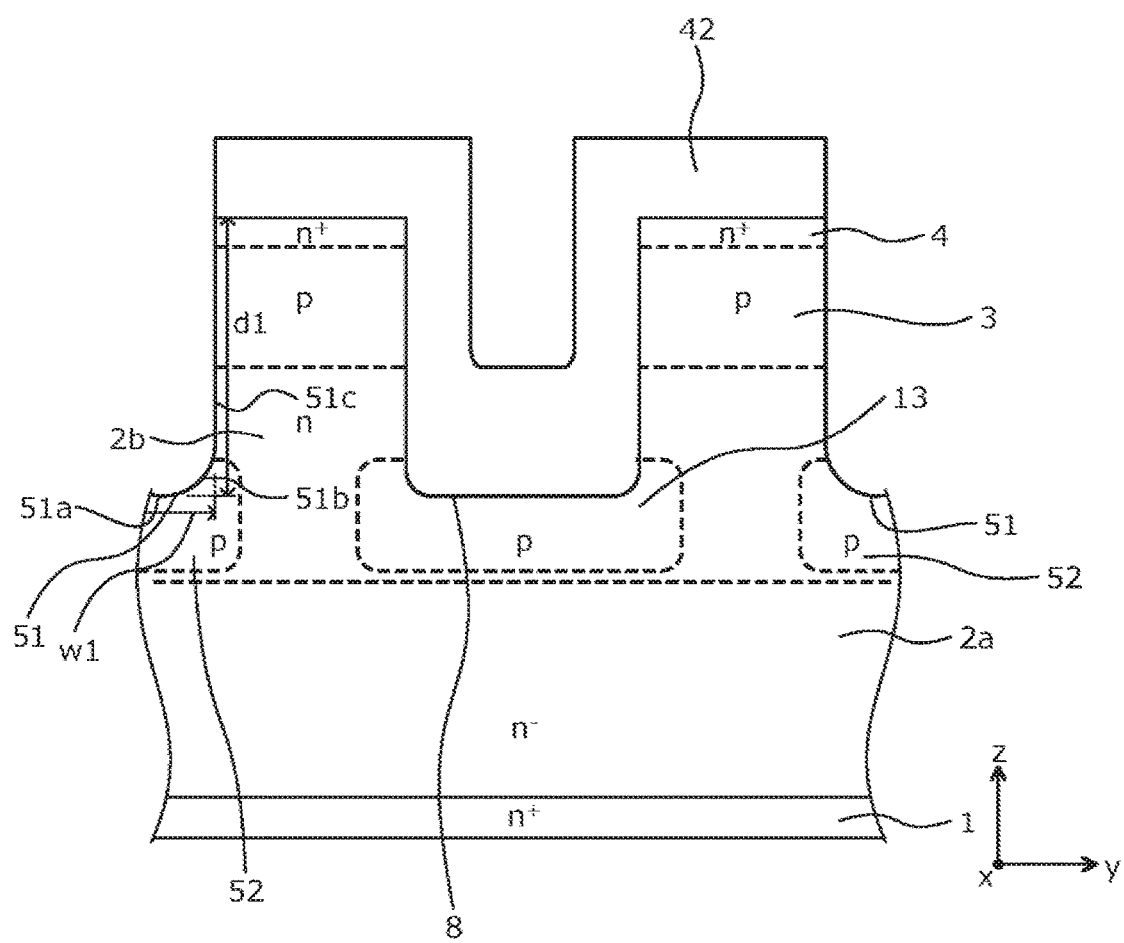

Subsequently, similar to the first embodiment, etching is performed by using the remaining portion of the oxide film 41 as a mask to form the contact trench 8 to the depth d2 allowing the bottom portion 8$a$ and the corner portions 8$b$ to reach the first p-type semiconductor region 13. The state at this point is depicted in FIG. 14. Subsequently, after removing the remaining portion of the oxide film 41 with, for example, hydrofluoric acid (HF), similar to the first embodiment, etching is performed by using the remaining portion of the oxide film 42 as a mask to form the gate trench 51. At this step, the gate trench 51 is formed to the depth d1 allowing the bottom portion 51$a$ and the corner portion 51$b$ to reach the second p-type semiconductor region 52. In this example, the depth d1 of the gate trench 51 is substantially the same as the depth d2 of the contact trench 8. The state at this point is depicted in FIG. 15.

The depth d2 of the contact trench 8 may be equal to or less than the depth d1 of the gate trench 51 and may be set within the same range as in the first embodiment. The width w2 of the contact trench 8 may be the same as in the first embodiment, for example. The depth d1 of the gate trench 51 may be set within the same range as in the first embodiment. The width w1 of the gate trench 51 may be the same as in the first embodiment. The gate trench 51 and the contact trench 8 may be formed in the reverse order. If the depth d1 of the gate trench 51 and the depth d2 of the contact trench 8 are the same, the gate trench 51 and the contact trench 8 may be formed using the same etching mask.

Figure 16:
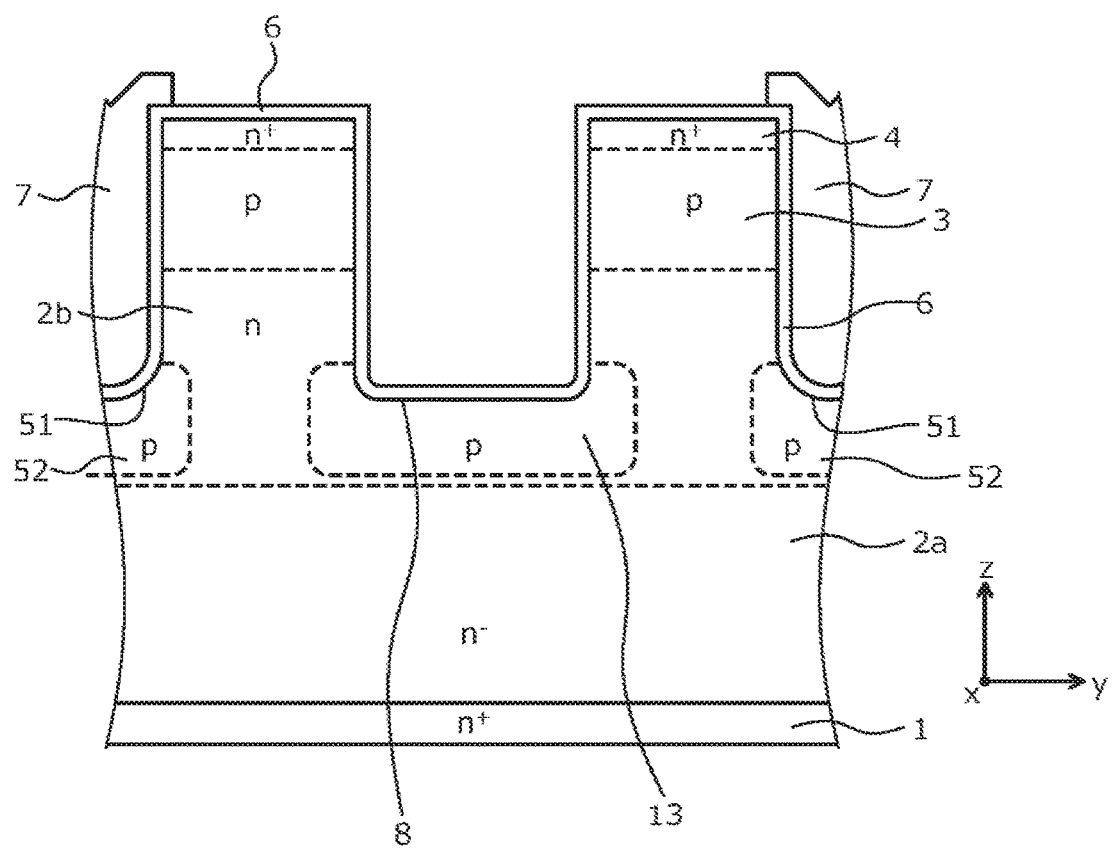

Subsequently, similar to the first embodiment, after formation of the oxide film 43 forming the gate insulating film 6, a gate polysilicon layer forming the gate electrode 7 is deposited and patterned. The state at this point is depicted in FIG. 16. Subsequently, similar to the first embodiment, the steps from the formation of the interlayer insulation film 9 are performed sequentially, and the trench type SiC-MOSFET depicted in FIG. 11 is completed.

As described above, according to the second embodiment, the same effect as in the first embodiment may be achieved. Additionally, according to the second embodiment, since the second p-type semiconductor region is disposed to cover the gate electrode via the gate insulating film at the entire surface of the bottom portion and the corner portion of the gate trench, the electric field applied to the gate insulating film may be relaxed at the bottom portion of the gate trench.

Figure 17:
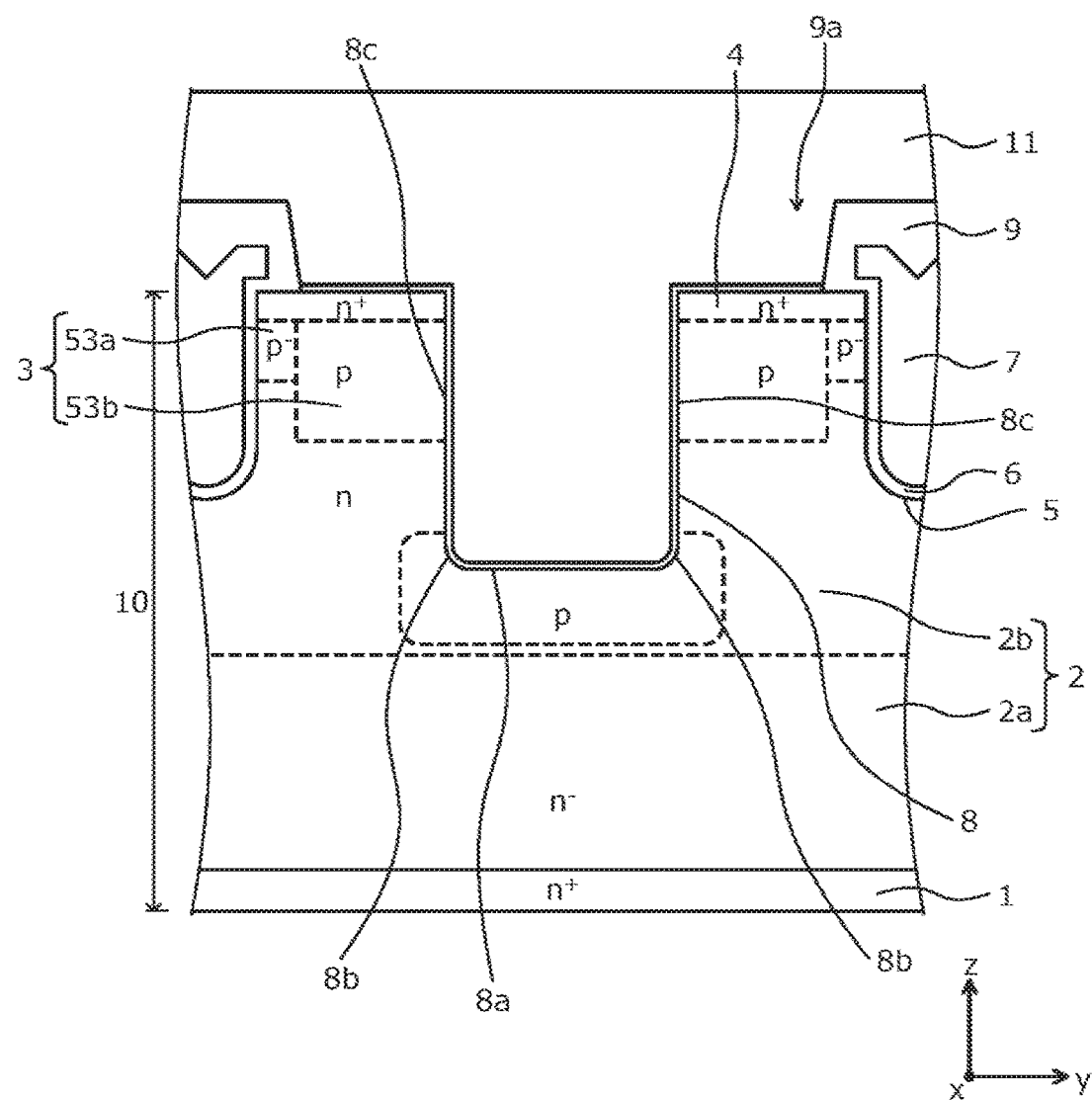
FIG. 17 is a cross-sectional view of a structure of an active region of the semiconductor device according to a third embodiment.

A structure of a semiconductor device according to a third embodiment will be described. FIG. 17 is a cross-sectional view of a structure of an active region of the semiconductor device according to the third embodiment. The planar layout near the contact trench 8 of FIG. 17 is the same as in the first embodiment (see FIG. 2). The semiconductor device according to the third embodiment is different from the semiconductor device according to the first embodiment in that the impurity concentration of the p-type base region 3 is made lower on the gate trench 5 side than the impurity concentration on the contact trench 8 side.

For example, in the surface layer of the base body front surface between each of the adjacent gate trenches 5 and the contact trench 8, a p$^-$-type region (second silicon carbide semiconductor layer) 53a is selectively disposed on the gate trench 5 side, and a p-type region (third semiconductor region) 53b is selectively disposed on the contact trench 8 side. The p$^-$-type region 53a faces the gate electrode 7 across the gate insulating film 6 disposed on the side wall of the gate trench 5. The p$^-$-type region 53a contacts the p-type region 53b on the contact trench 8 side. The depth of the p$^-$-type region 53a may be shallower than the depth of the p-type region 53b. The p-type region 53b is exposed at the side wall 8c of the contact trench 8.

For example, for a breakdown voltage of 3300 V, the impurity concentration of the p$^-$-type region 53a may be about $1\times10^{14}/cm^3$ or more and $1\times10^{16}/cm^3$ or less, for example. The p-type region 53b is disposed at a distance of about 0.01 μm or more and 0.2 μm or less from the side wall of the gate trench 5, for example. The impurity concentration of the p-type region 53b may be about $1\times10^{17}/cm^3$ or more and $1\times10^{20}/cm^3$ or less, for example. The p$^-$-type region 53a and the p-type region 53b function as the p-type base region 3. The p$^-$-type region 53a and the p-type region 53b (the p-type base region 3) have the n$^+$-type source region 4 and the p$^+$-type contact region (not depicted) each selectively disposed therein in the same planar layout as in the first embodiment.

In a method of manufacturing the semiconductor device according to the third embodiment, after a p$^-$-type epitaxial layer forming the p$^-$-type region 53a is grown on the second n-type drift region 2b, the p-type region 53b penetrating the p$^-$-type region 53a to the second n-type drift region 2b may be formed selectively in the method of manufacturing the semiconductor device according to the first embodiment.

For example, similar to the first embodiment, the steps are performed sequentially from the formation of the first n$^-$-type drift region 2a through the formation of the p-type semiconductor region 13 to the epitaxial growth of the second n-type drift region 2b. The p$^-$-type epitaxial layer forming the p$^-$-type region 53a is grown on the second n-type drift region 2b. Subsequently, the p-type region 53b penetrating the p$^-$-type region 53a to the second n-type drift region 2b is selectively formed by photolithography and ion implantation.

The thickness of the p$^-$-type epitaxial layer forming the p$^-$-type region 53a may be about 0.3 μm or more and 2.0 μm or less, for example. The depth of the p-type region 53b from the base body front surface reaches a position deeper, i.e., lower than the p$^-$-type region 53a from the boundary with the n$^+$-type source region 4. Subsequently, similar to the first embodiment, the steps from the formation of the n$^+$-type source region 4 and the p$^+$-type contact region 14 are performed sequentially, and the trench type SiC-MOSFET depicted in FIG. 17 is completed.

As described above, according to the third embodiment, the same effects as the first and second embodiments may be achieve. Additionally, according to the third embodiment, since the gate trench side of the p-type base region is a p$^-$-type region with a lower impurity concentration than the contact trench side, channel mobility may be increased without reducing a gate threshold voltage for the element structure on the base body front surface side of the active region.

Figure 18:
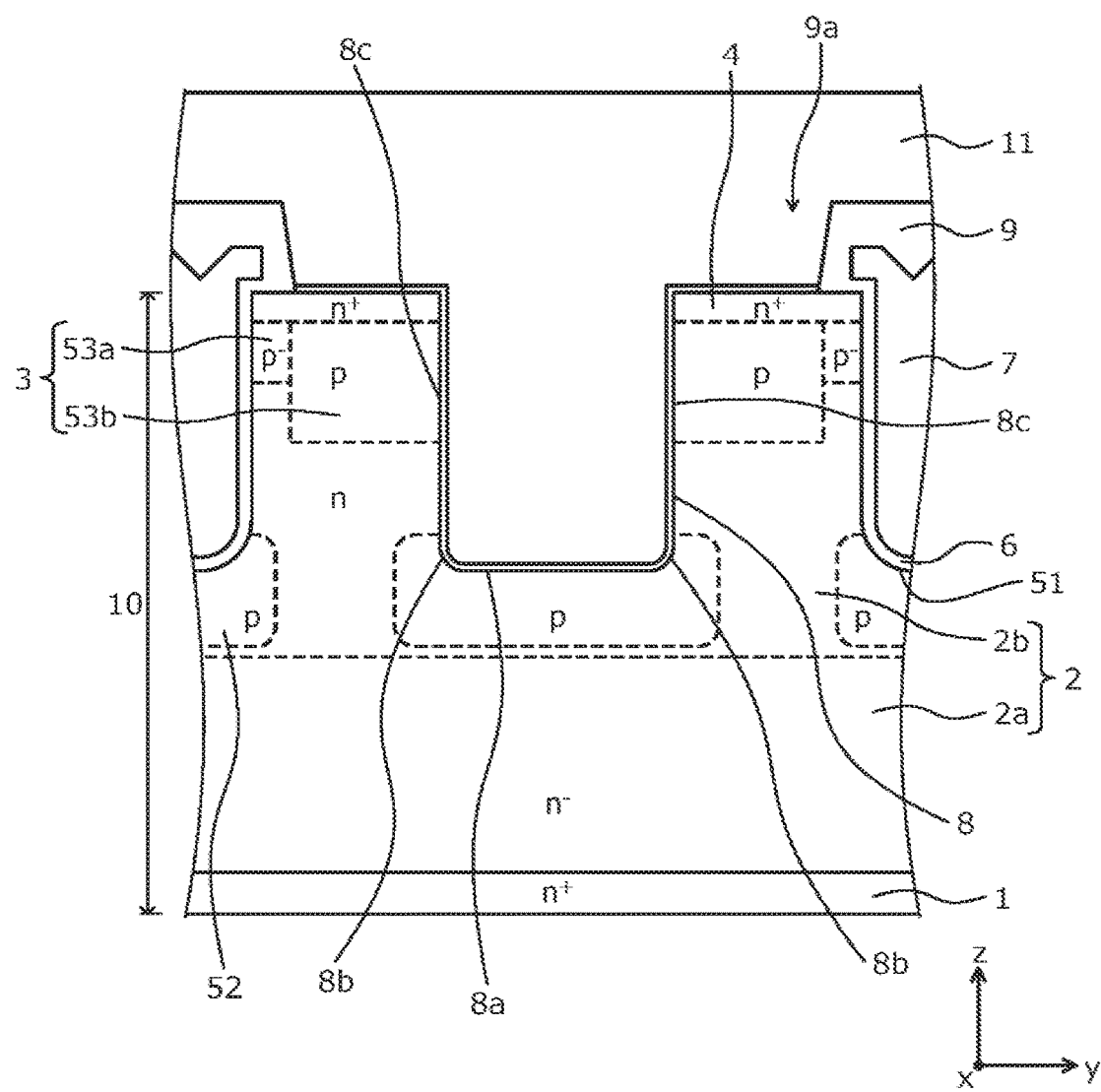
FIG. 18 is a cross-sectional view of a structure of an active region of the semiconductor device according to a fourth embodiment.

A structure of a semiconductor device according to a fourth embodiment will be described. FIG. 18 is a cross-sectional view of a structure of an active region of the semiconductor device according to the fourth embodiment. The planar layout near the contact trench 8 in FIG. 18 is the same as in the first embodiment (see FIG. 2). The semiconductor device according to the fourth embodiment has a configuration obtained by applying the third embodiment to the second embodiment.

Therefore, the semiconductor device according to the fourth embodiment includes the second p-type semiconductor region 52 disposed at the bottom portion 51a and the corner portion 51b of the gate trench 51, and the p-type base region 3 made up of the p$^-$-type region 53a and the p-type region 53b. In a method of manufacturing the semiconductor device according to the fourth embodiment, after the steps from the formation of the first n$^-$-type drift region 2a to the formation of the p$^-$-type region 53a and the p-type region 53b are performed sequentially similar to the third embodiment, the steps from the formation of the n$^+$-type source region 4 and the p$^+$-type contact region 14 may be performed sequentially similar to the second embodiment.

As described above, according to the fourth embodiment, the same effects as the first to third embodiments may be achieved.

Figure 19:
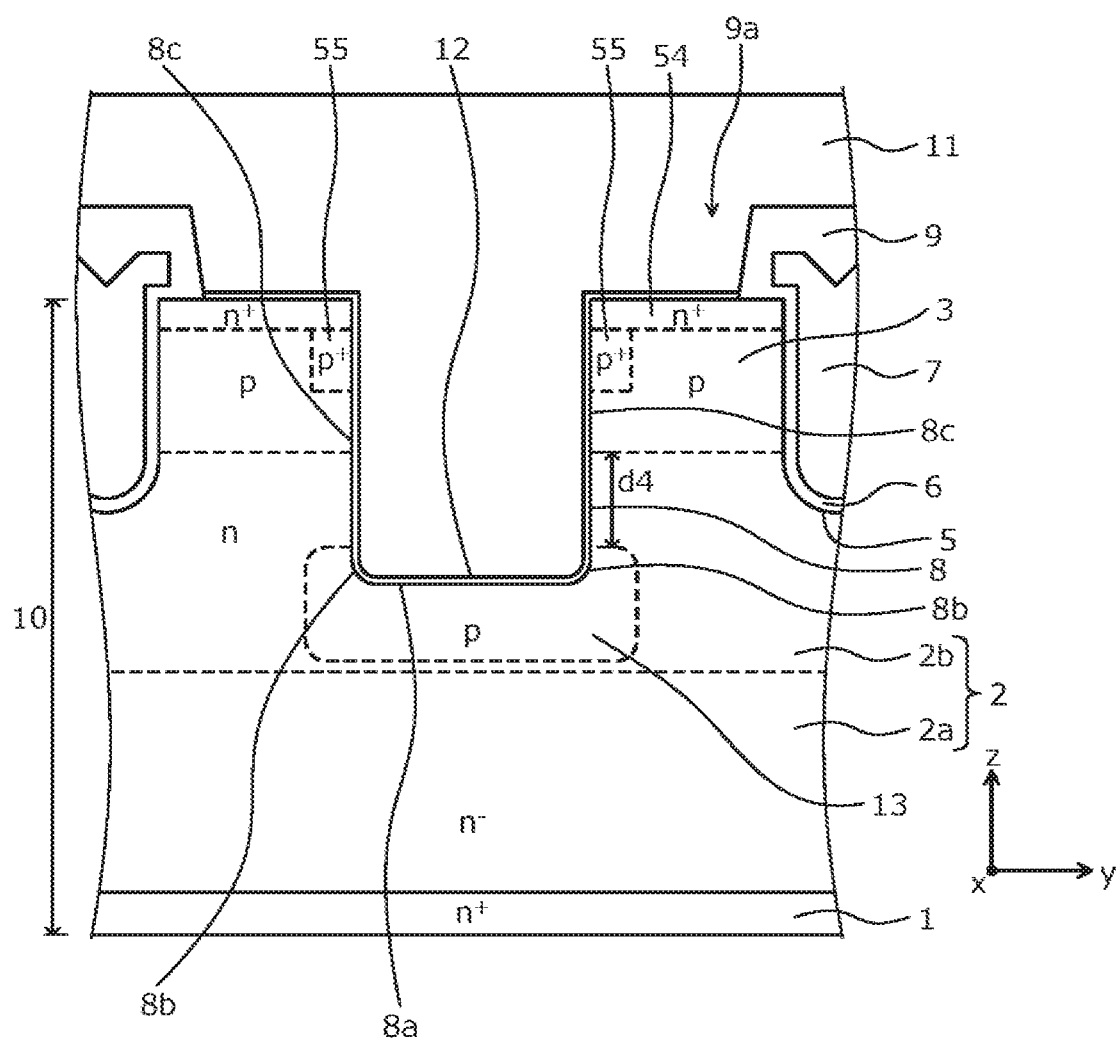
FIG. 19 is a cross-sectional view of a structure of an active region of the semiconductor device according to a fifth embodiment.
Figure 20:
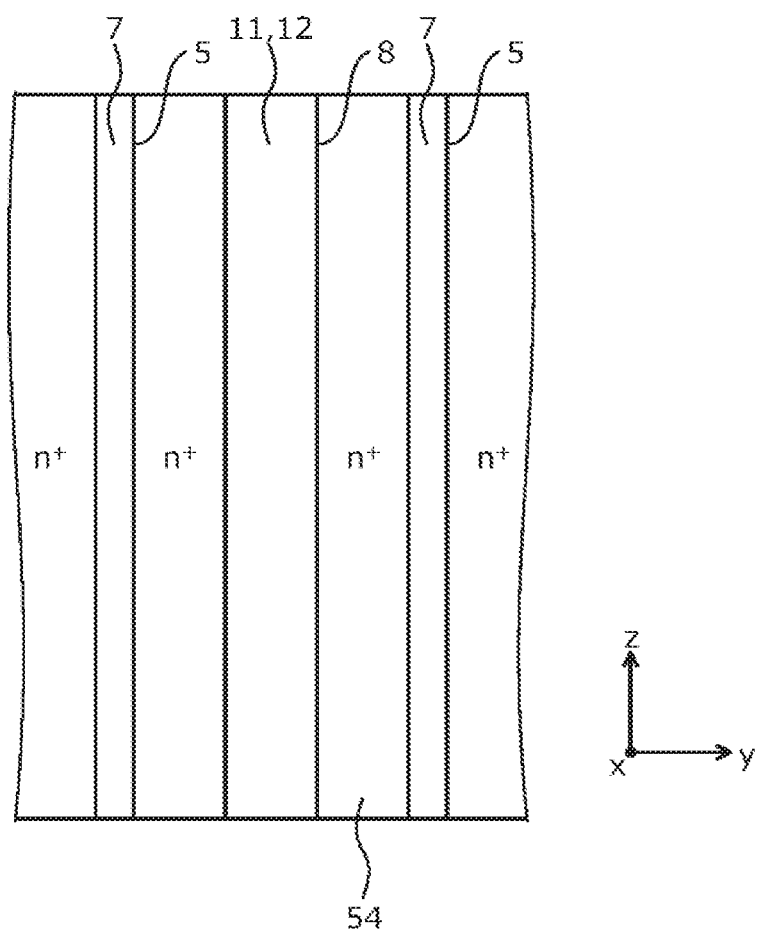
FIG. 20 is a plane view of a planar layout near a contact trench in FIG. 19.

A structure of a semiconductor device according to a fifth embodiment will be described. FIG. 19 is a cross-sectional view of a structure of an active region of the semiconductor device according to the fifth embodiment. FIG. 20 is a plane view of a planar layout near a contact trench in FIG. 19. In FIG. 20, the gate insulating film 6 is not depicted. The semiconductor device according to the fifth embodiment is different from the semiconductor device according to the first embodiment in that a p$^+$-type contact region (fifth semiconductor region) 55 is selectively disposed on the contact trench 8 side between each of the adjacent gate trenches 5 and the contact trench 8 at a position deeper than an n$^+$-type source region (second semiconductor region) 54.

The n+-type source region 54 is disposed between each of the adjacent gate trenches 5 and the contact trench 8 in the entire surface layer on the base body front surface side of the p-type base region 3 and is exposed on the entire base body front surface (FIG. 20).

A method of manufacturing the semiconductor device according to the fifth embodiment is different from the method of manufacturing the semiconductor device according to the first embodiment in that after the formation of the contact trench 8, p-type impurities are ion-implanted from each of the side walls 8c of the contact trench 8 to form the p+-type contact region 55. For example, first, similar to the first embodiment, the steps are performed sequentially from the formation of the n−-type drift region 2a to the formation of the p-type base region 3. Subsequently, the n+-type source region 54 is selectively formed by photolithography and ion implantation of n-type impurities in the entire surface layer of the p-type base region 3 in the active region. The ion implantation conditions of the n+-type source region 54 may be the same as in the first embodiment. The contact trench 8 is then formed that penetrates the n+-type source region 54 and the p-type base region 3 to the p-type semiconductor region 13 inside the second n-type drift region 2b. A method of forming the contact trench 8 is the same as in the first embodiment. The depth of the contact trench 8 may be the same as in the first embodiment. The width of the contact trench 8 may be about 0.1 µm or more and 10.0 µm or less, for example.

Subsequently, ion implantation of p-type impurities such as aluminum in an oblique direction (hereinafter referred to as tilted ion implantation) is performed to one of the side walls 8c of the contact trench 8 to selectively form the p+-type contact region 55 inside the p-type base region 3 exposed on the one side wall 8c of the contact trench 8. The angle of this tilted ion implantation may be, for example, about 25 degrees or more and 89 degrees or less relative to the one side wall 8c of the contact trench 8. The tilted ion implantation of p-type impurities is then performed to the other side wall 8c of the contact trench 8 to selectively form the p+-type contact region 55 inside the p-type base region 3 exposed on the other side wall 8c of the contact trench 8. The angle of this tilted ion implantation may be, for example, about −89 degrees or more and −25 degrees or less relative to the other side wall 8c of the contact trench 8. In the tilted ion implantations, the p+-type contact region 55 is formed to contact a lower surface (a surface on the drain side) of the n+-type source region 54. The conditions of the tilted ion implantations may include, for example, an acceleration energy of about 30 keV and a dose amount of $1\times10^{13}/cm^2$ or more and $1\times10^{15}/cm^2$ or less. As a result, the p+-type contact region 55 is selectively formed inside the p-type base region 3 and exposed on each of the side walls 8c of the contact trench 8 at an impurity concentration of $1\times10^{17}/cm^3$ or more, for example. Subsequently, similar to the first embodiment, the steps from the formation of the gate insulating film 6 are performed in order, and the trench type SiC-MOSFET depicted in FIGS. 19, 20 is completed.

In the method of manufacturing the semiconductor device according to the fifth embodiment described above, the p+-type contact region 55 may be formed selectively by photolithography and ion implantation (ion implantation in a direction orthogonal to the base body front surface) after the formation of the p-type base region 3 and before the formation of the n+-type source region 54 instead of the tilted ion implantation. In this case, the impurity concentration of the p+-type contact region 55 may be about $1\times10^{17}/cm^3$ or more and $1\times10^{20}/cm^3$ or less, for example.

As described above, according to the fifth embodiment, the same effect as in the first embodiment may be achieved. Additionally, the second to fourth embodiments are applicable to the fifth embodiment and the same effects as the second to fourth embodiments may be achieved.

Figure 21:
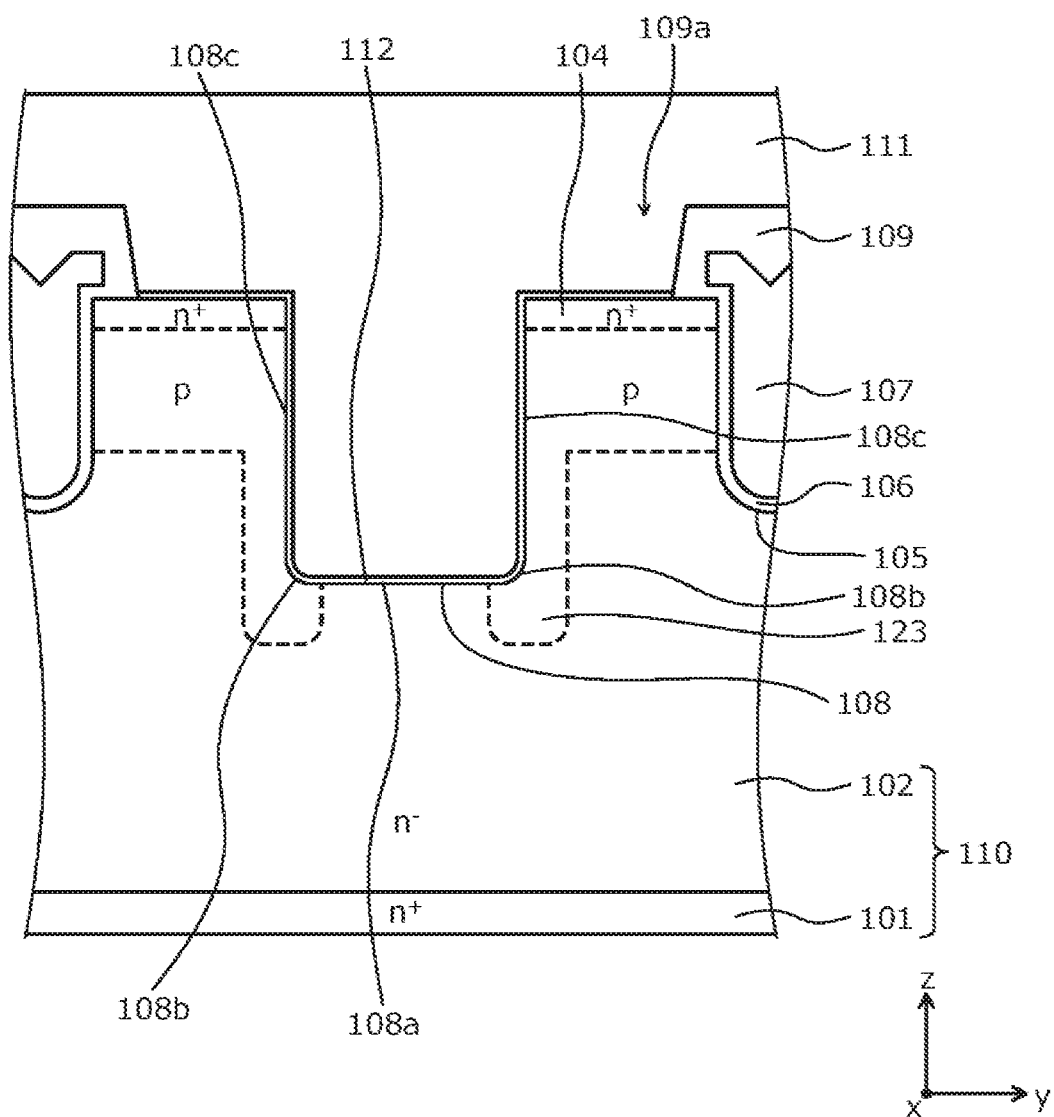
FIG. 21 is a cross-sectional view of a structure of an active region of a trench type SiC-MOSFET used as Comparison Example 1.
Figure 22:
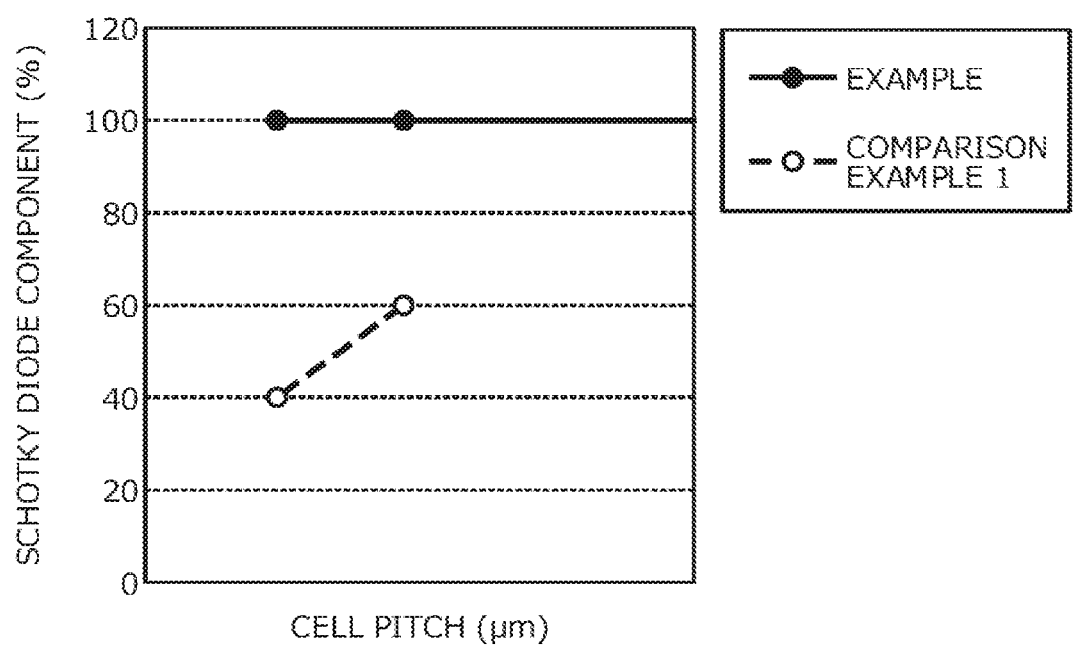
FIG. 22 is a characteristic diagram of a proportion of a Schottky diode component of a semiconductor device according to Example.

Here, Example 1 will be described. The semiconductor device according to the present invention was verified in terms of the proportion of current flowing through a parasitic Schottky diode (hereinafter referred to as a Schottky diode component) of the current flowing between source and drain. FIG. 21 is a cross-sectional view of a structure of an active region of a trench type SiC-MOSFET used as Comparison Example 1. FIG. 22 is a characteristic diagram of a proportion of a Schottky diode component of a semiconductor device according to Example. A trench type SiC-MOSFET was produced under the conditions described above according to the method of manufacturing the semiconductor device according to the first embodiment (see FIGS. 1 and 2) (hereinafter referred to as Example). Therefore, a parasitic Schottky diode is formed in the side walls 8c of the contact trench 8 in Example.

Figure 26:
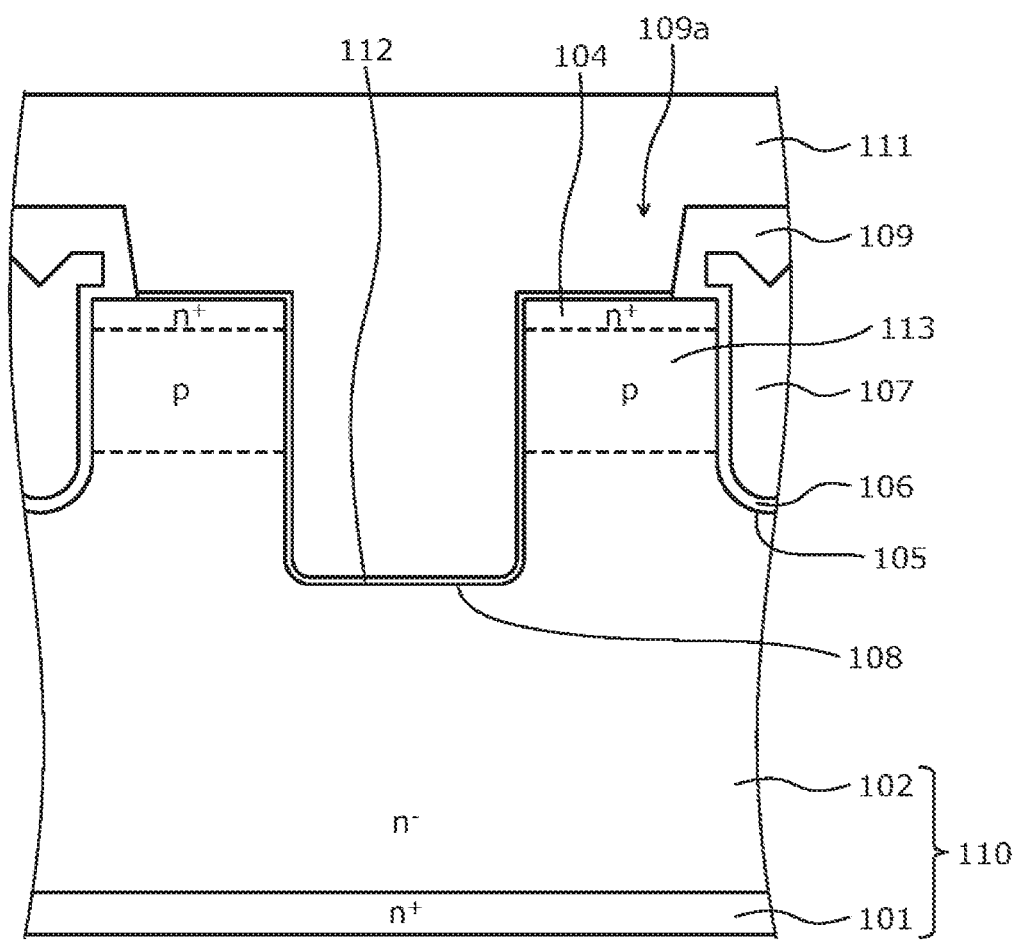
FIG. 26 is a cross-sectional view of a structure of an active region of another example of a conventional trench type SiC-MOSFET.

For comparison, as depicted in FIG. 21, a conventional trench type SiC-MOSFET was produced that had a parasitic pn diode turned on as a free-wheeling diode at the time of turning off the MOSFET although a parasitic Schottky diode was formed in an inner wall of a contact trench 108 (hereinafter referred to as Comparison Example 1). Comparison Example 1 corresponds to Japanese Laid-Open Patent Publication No. 2013-243207, for example. For example, Comparison Example 1 is provided with a p-type base region 123 covering the front surface electrode at the surface of side walls 108c and corner portions 108b of the contact trench 108 entirely and has the parasitic Schottky diode formed in a bottom portion 108a of the contact trench 108. The configuration of Comparison Example 1 other than the p-type base region 123 is the same as Conventional Example 2 (see FIG. 26).

FIG. 22 depicts the proportion of the Schottky diode component to the current flowing between source and drain (=Schottky diode component/current flowing between source and drain×100 [%]) when a body diode is used as a free-wheeling diode and the free-wheeling diode is turned on in Example and Comparison Example 1. The proportion of current flowing through a parasitic pn diode of the current flowing between source and drain (hereinafter referred to as a pn diode component) is calculated by 100−the Schottky diode component proportion [%].

From a result depicted in FIG. 22, it was confirmed in Comparison Example 1 that current flows between source and drain via the parasitic diode and the parasitic Schottky diode. The proportion of the Schottky diode component varies depending on the cell pitch of the MOSFET. Therefore, in Comparison Example 1, when the parasitic diode is turned on and energized, degradation over time is caused by the bipolar operation of the parasitic diode. In contrast, it was confirmed in Example that current flows between source and drain via the parasitic Schottky diode without passing through the parasitic diode and without turning on the parasitic diode (Schottky diode component=100%). Therefore, it was confirmed in Example that degradation over time is not caused by to the bipolar operation of the parasitic diode.

Figure 23:
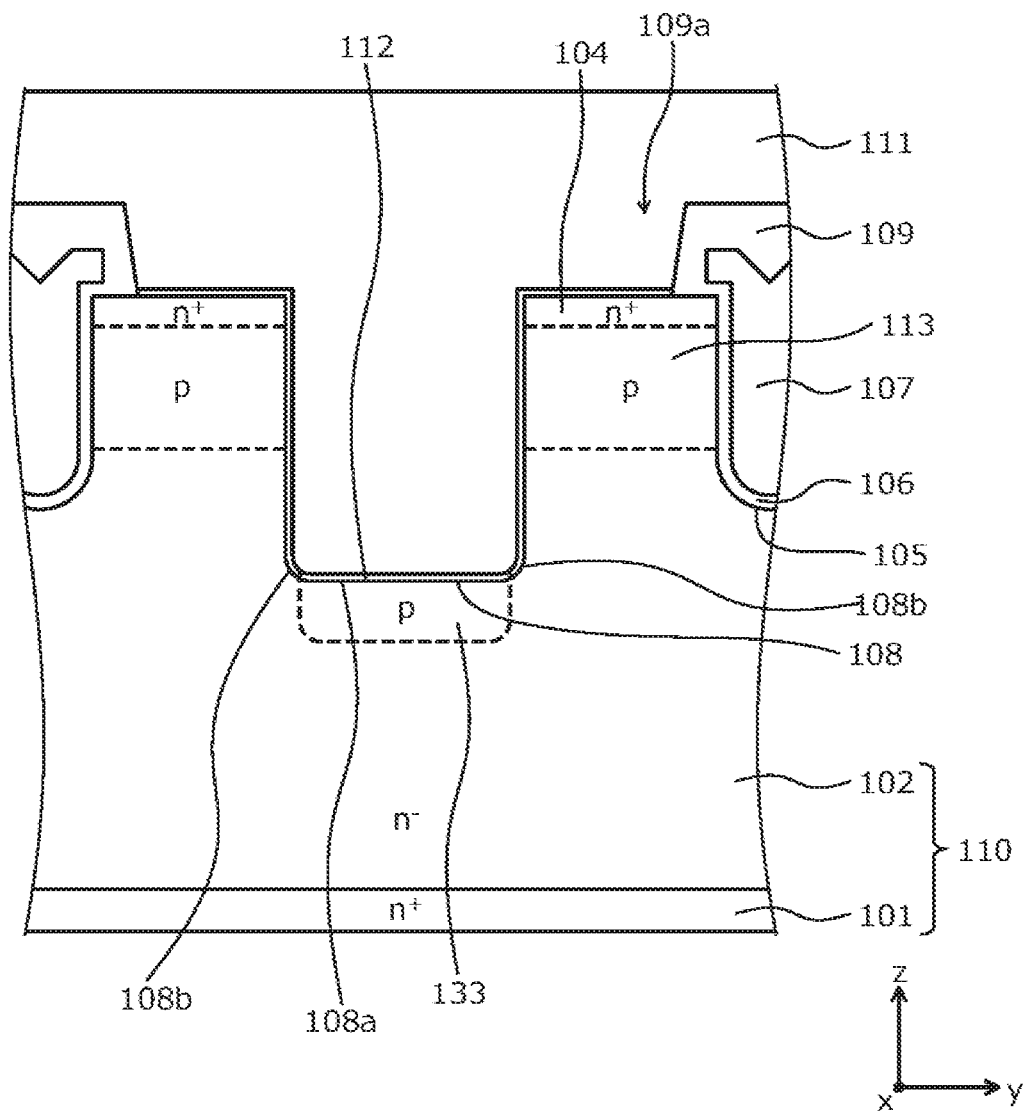
FIG. 23 is a cross-sectional view of a structure of an active region of a trench type SiC-MOSFET used as Comparison Example 2.
Figure 24:
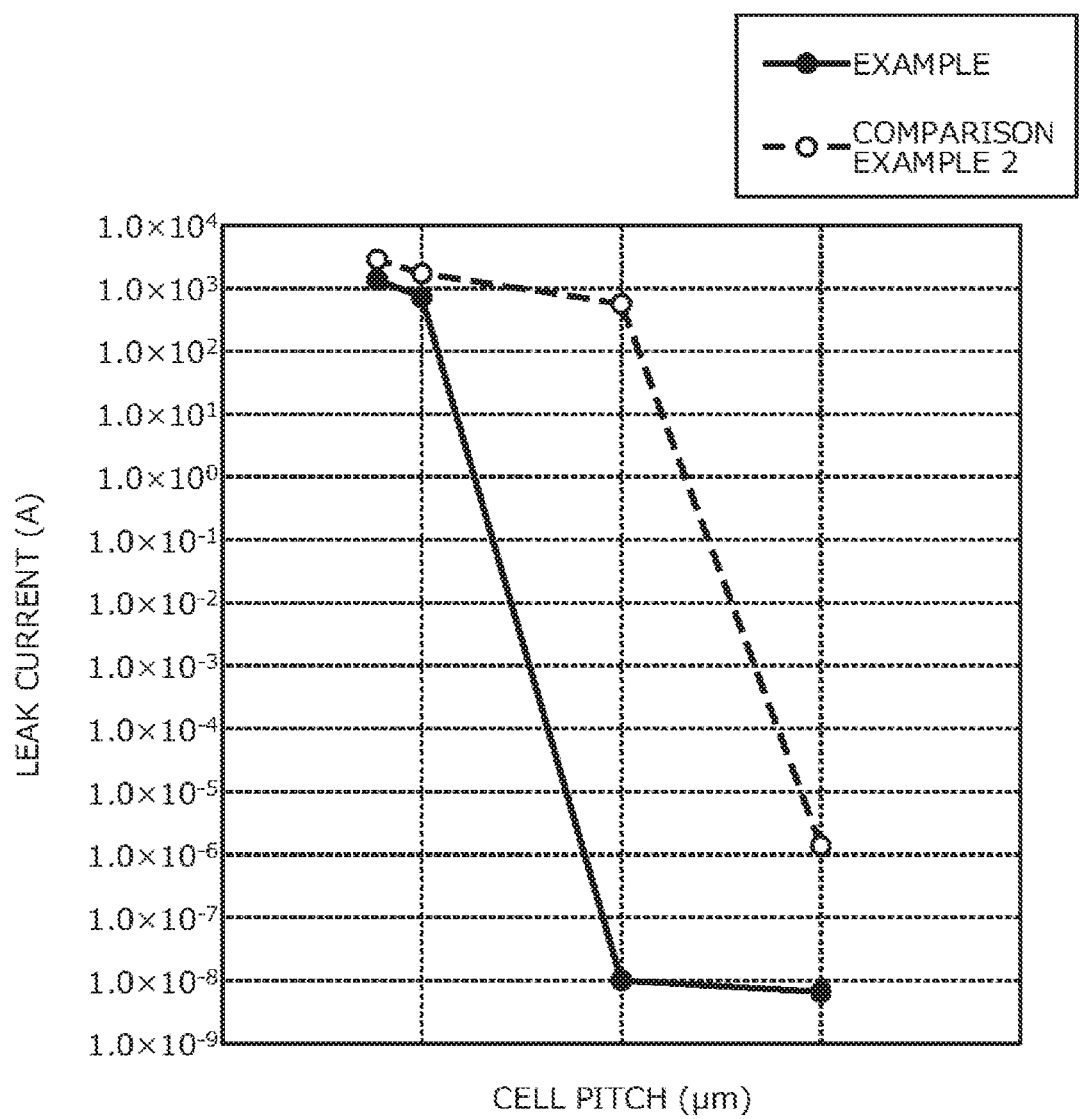
FIG. 24 is a characteristic diagram of leak current of a semiconductor device according to Example.
Figure 25:
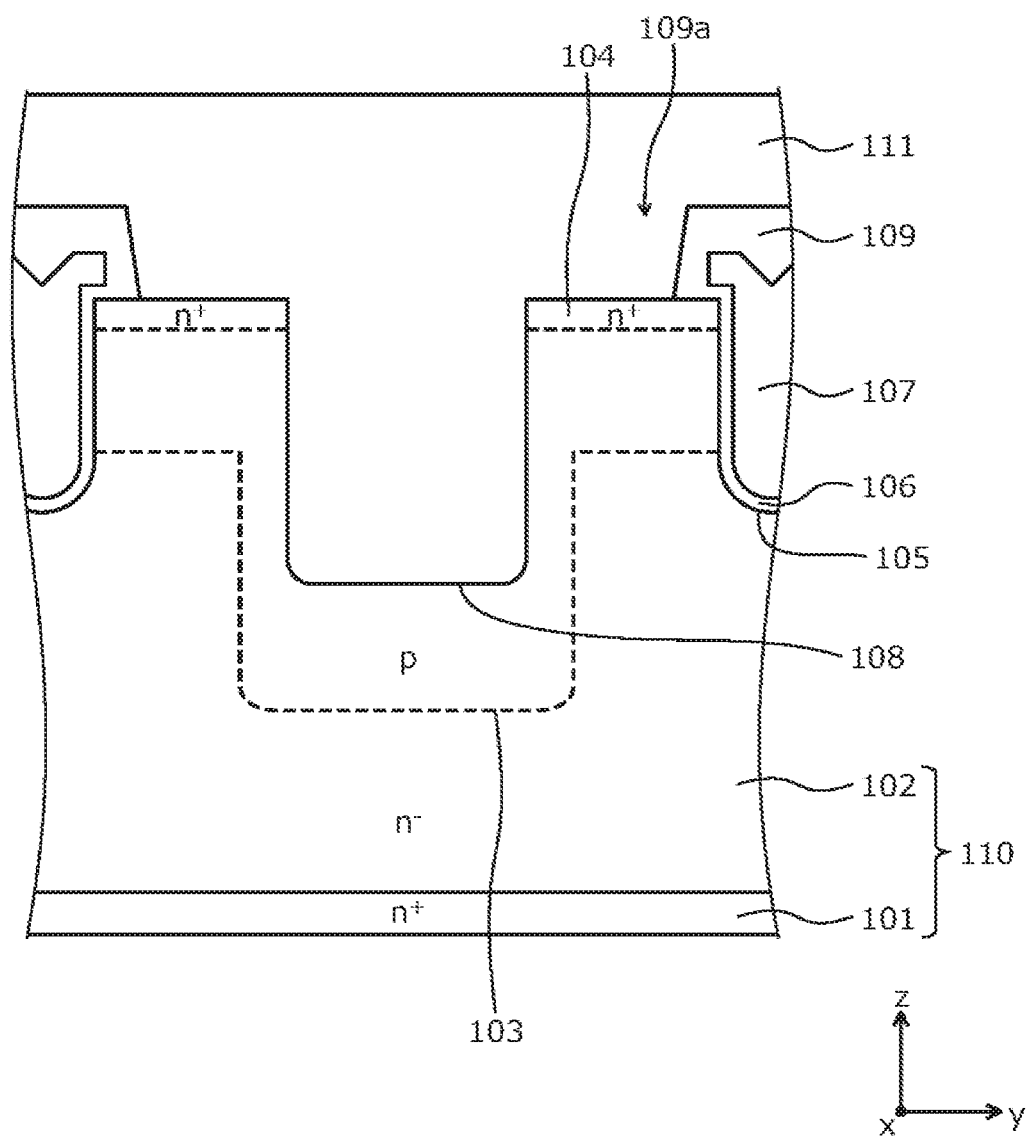
FIG. 25 is a cross-sectional view of a structure of an active region of a conventional trench type SiC-MOSFET.

Here, Example 2 will be described. Leak current of Example described above was verified. FIG. 23 is a cross-sectional view of a structure of an active region of a trench type SiC-MOSFET used as Comparison Example 2. FIG. 24 is a characteristic diagram of leak current of a semiconductor device according to Example. For comparison, as depicted in FIG. 23, a conventional trench type SiC-MOSFET was produced that had increased leak current because of a built-in parasitic Schottky diode (hereinafter referred to as Comparison Example 2). Comparison Example 2 corresponds to Japanese Laid-Open Patent Publication No. 2009-278067, for example. For example, Comparison Example 2 is provided with a p-type semiconductor region 133 covering the front surface electrode at a bottom portion 108a of the contact trench 108 and has the parasitic Schottky diode formed in the side walls 108c and the corner portions 108b of the contact trench 108. The configuration of Comparison Example 2 other than the p-type semiconductor region 133 is the same as Conventional Example 2 (see FIG. 26).

FIG. 24 depicts a result of measurement of the leak current of Example and Comparison Example 2. From the result depicted in FIG. 24, it was confirmed that the leak current may be reduced in Example as compared to Comparison Example 2.

The present invention described above may be modified variously without departing from the spirit of the present invention and, for example, the dimensions and the impurity concentrations of the portions and the formation conditions of the portions are be set variously in the embodiments described above depending on required specifications, etc. Although the first conductivity type is the n-type and the second conductivity type is the p-type in the embodiments, the present invention is implemented in the same way by defining the first conductivity type as the p-type and the second conductivity type as the n-type.

With the conventional technologies, because a high electric field is applied to a Schottky junction formed at the bottom portion of the contact trench at the time of turning off the MOSFET, Conventional Example 2 (see FIG. 26), Japanese Laid-Open Patent Publication Nos. 2011-134910 and 2013-243207, and Japanese Patent No. 4874516 have a problem of high leak current flowing through the Schottky junction. Additionally, in Conventional Example 2, Japanese Laid-Open Patent Publication Nos. 2011-134910 and 2013-243207, and Japanese Patent No. 4874516, the front surface electrode is not covered with the p-type region at the bottom portion of the contact trench and therefore, in a state in which the parasitic Schottky diode is turned on, the parasitic pn diode is also turned on at the same time. This leads to a problem of degradation over time caused by the bipolar operation of the parasitic pn diode. Japanese Laid-Open Patent Publication No. 2009-278067 has a problem of large leak current at the time of turning off the MOSFET because the front surface electrode is not covered with the p-type region in a corner portion of the contact trench. The corner portion of the contact trench is a place where a bottom portion and a side wall of the contact trench meet each other and is a corner curved with a predetermined curvature.

However, according to the invention described above, since the Schottky junction of the first silicon carbide semiconductor layer and the metal electrode is formed only at a portion of the side wall of the second trench, when a parasitic Schottky diode formed by the first silicon carbide semiconductor layer and the metal electrode is turned on, a parasitic pn diode formed by the second silicon carbide semiconductor layer and the first silicon carbide semiconductor layer does not turn on. Further, the metal electrode is covered with the first semiconductor region at the entire corner portion and bottom portion of the second trench and therefore, when the MOSFET is off, the electric field applied to the Schottky junction of the first silicon carbide semiconductor layer and the metal electrode may be relaxed.

The semiconductor device and the method of manufacturing a semiconductor device according to the present invention produce an effect that the degradation over time caused by the bipolar operation of the parasitic pn diode may be prevented while the leak current may be reduced.

As described above, the semiconductor device and the method of manufacturing a semiconductor device according to the present invention are useful to a semiconductor device used in a power converter such as a converter/inverter.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a first silicon carbide semiconductor layer of a first conductivity type;
    a first semiconductor region of a second conductivity type, selectively disposed in the first silicon carbide semiconductor layer so that an upper surface of the first semiconductor region is disposed lower than an upper surface of the first silicon carbide semiconductor layer;
    a second silicon carbide semiconductor layer of the second conductivity type, disposed on the upper surface of the first silicon carbide semiconductor layer;
    a second semiconductor region of the first conductivity type, selectively disposed in the second silicon carbide semiconductor layer;
    a first trench penetrating the second semiconductor region and the second silicon carbide semiconductor layer so as to reach the first silicon carbide semiconductor layer;
    a second trench disposed away from the first trench in a plan view, the second trench penetrating the second semiconductor region and the second silicon carbide semiconductor layer so as to reach the first semiconductor region through the first silicon carbide semiconductor layer;
    a gate insulating film formed on a side wall of the first trench;
    a gate electrode disposed inside the first trench and formed on the gate insulating film; and
    a metal electrode embedded inside the second trench so as to contact the second semiconductor region and the second silicon carbide semiconductor layer as well as to contact the first semiconductor region at a bottom portion and a corner portion of the second trench so as to form a Schottky junction with the first silicon carbide semiconductor layer, in a side wall of the second trench.

2. The semiconductor device according to claim 1, wherein
    the first semiconductor region has a width greater than a width of the second trench.

3. The semiconductor device according to claim 1, further comprising
    a third semiconductor region of the second conductivity type, penetrating the second silicon carbide semiconductor layer in a depth direction so as to reach the first silicon carbide semiconductor layer and contacting the metal electrode in the side wall of the second trench, the third semiconductor region having an impurity concentration higher than that of the second silicon carbide semiconductor layer.

4. The semiconductor device according to claim 1, wherein
the second trench has a depth equal to or greater than a depth of the first trench.

5. The semiconductor device according to claim 1, further comprising
a fourth semiconductor region of the second conductivity type, selectively disposed inside the first silicon carbide semiconductor layer and facing the gate electrode via the gate insulating film at the bottom portion and the corner portion of the first trench.

6. The semiconductor device according to claim 5, wherein
the second trench has a depth equal to or greater than a depth of the first trench.

7. The semiconductor device according to claim 1, further comprising
a fifth semiconductor region of the second conductivity type, selectively disposed in the second silicon carbide semiconductor layer and having an impurity concentration higher than that of the second silicon carbide semiconductor layer, wherein
the second semiconductor region and the fifth semiconductor region are alternately arranged along a direction orthogonal to a direction of arrangement of the first trench and the second trench.

8. The semiconductor device according to claim 1, further comprising
a fifth semiconductor region of the second conductivity type, selectively disposed in the second silicon carbide semiconductor layer, at a position lower than the second semiconductor region, the fifth semiconductor region contacting the metal electrode at the side wall of the second trench and having an impurity concentration higher than that of the second silicon carbide semiconductor layer.

9. The semiconductor device according to claim 1, further comprising
a third silicon carbide semiconductor layer of the first conductivity type, disposed on a lower surface of the first silicon carbide semiconductor layer, the third silicon carbide semiconductor layer having an impurity concentration higher than the first silicon carbide semiconductor layer.

10. A method of manufacturing a semiconductor device, the method comprising:

selectively forming a first semiconductor region of a second conductivity type, in a first silicon carbide semiconductor layer of a first conductivity type, so that an upper surface of the first semiconductor region is disposed deeper than an upper surface of the first silicon carbide semiconductor layer;

forming a second silicon carbide semiconductor layer of the second conductivity type, on the upper surface of the first silicon carbide semiconductor layer;

selectively forming a second semiconductor region of the first conductivity type, in the second silicon carbide semiconductor layer;

forming a first trench penetrating the second semiconductor region and the second silicon carbide semiconductor layer so as to reach the first silicon carbide semiconductor layer;

forming a second trench away from the first trench in a plan view, the second trench penetrating the second semiconductor region and the second silicon carbide semiconductor layer so as to reach the first semiconductor region through the first silicon carbide semiconductor layer;

forming a gate electrode in the first trench on a gate insulating film formed on a side wall of the first trench; and embedding a metal electrode inside the second trench such that the metal electrode contacts the second semiconductor region and the second silicon carbide semiconductor layer as well as contacts the first semiconductor region at a bottom portion and a corner portion of the second trench so as to form a Schottky junction between the first silicon carbide semiconductor layer and the metal electrode, in a side wall of the second trench.

11. The method of manufacturing a semiconductor device according to claim 10, wherein the selectively forming a first semiconductor region includes
selectively forming the first semiconductor region in a surface portion of the first silicon carbide semiconductor layer, and
increasing a thickness of the first silicon carbide semiconductor layer so that an upper surface of the first semiconductor region becomes lower than the upper surface of the first silicon carbide semiconductor layer.

* * * * *